(12) United States Patent
Trequattrini et al.

(10) Patent No.: US 6,198,286 B1
(45) Date of Patent: Mar. 6, 2001

(54) MAGNET STRUCTURE, PARTICULARLY FOR NUCLEAR MAGNETIC RESONANCE IMAGING MACHINES

(75) Inventors: Alessandro Trequattrini; Carlo Sanfilippo; Gianluca Coscia, all of Genova (IT)

(73) Assignee: Esaote S.p.A., Monferrato (IT)

( * ) Notice: Subject to any disclaimer, the term of this patent is extended or adjusted under 35 U.S.C. 154(b) by 0 days.

(21) Appl. No.: 09/301,344

(22) Filed: Apr. 29, 1999

(30) Foreign Application Priority Data

May 11, 1998 (IT) .............................. SV98A0028

(51) Int. Cl.[7] ..................................... G01V 3/00
(52) U.S. Cl. .................... 324/319; 324/300; 324/307; 335/306; 335/297
(58) Field of Search .................. 324/319, 300, 324/307; 335/297, 306

(56) References Cited

U.S. PATENT DOCUMENTS 5,283,544  2/1994  Sakurai et al. ................ 335/297

FOREIGN PATENT DOCUMENTS 0 623 939 A1   11/1994   (EP) .
4-23411        1/1992    (JP) .

OTHER PUBLICATIONS

Magnetic Structure Design Method; C. Blache et al.; IEEE Transactions on Magnetics; vol. 20, No. 5, Sep. 1993.

Permanent Sextupole Magnets; Yoshihisa Wakuta et al.; Nuclear Instruments and Methods in Physics Research A260 (1987). pp. 543–545.

*Primary Examiner*—Hezron Williams
*Assistant Examiner*—Brij B. Shrivastav
(74) *Attorney, Agent, or Firm*—Burns, Doane, Swecker & Mathis, L.L.P.

(57) ABSTRACT

A magnet structure, particularly for Nuclear Magnetic Resonance imaging machines, and of the type having a bearing structure for means for generating magnetic fields inside a volume, a cavity or similar space, defined by the structure, is made to be modular at least for part of the bearing structure, and/or at least for part of the other construction elements.

45 Claims, 23 Drawing Sheets

MAGNET STRUCTURE, PARTICULARLY FOR NUCLEAR MAGNETIC RESONANCE IMAGING MACHINES

BACKGROUND OF THE INVENTION

1. Field of the Invention

The invention relates to a magnet structure, particularly for Nuclear Magnetic Resonance imaging machines and of the type comprising a bearing structure for generating magnetic fields inside a volume, a cavity or similar space, defined by the structure.

The invention particularly relates, but is not limited, to magnet structures for Nuclear Magnetic Resonance imaging machines of the type known as dedicated machines, i.e., designed for Nuclear Magnetic Resonance imaging of individual parts of the body, and in which the volume or cavity are such that they generally do not house therein the whole patient, or a considerable part thereof, but only the part limited to one of a few limbs or body regions.

One aspect of the invention relates to magnet structures for permanent magnets.

2. Description of Related Art

Prior art magnet structures have a bearing structure generally made of a ferromagnetic or high-permeability material, with layers of magnetized material, eventually associated with further layers of a more or less permeable material, being fixed thereto in a predetermined position. Although, in dedicated machines, the magnet structure is dimensionally reduced, it is still considerably large.

The fabrication of magnets also requires a high accuracy in dimensioning and mutually positioning the parts forming the structure. This requirement is urged by the fact that, inside the relevant volume wherein the body or the part thereof under examination has to be received, the magnetic field must have high homogeneity characteristics.

The manufacture of the parts forming the magnet structure with the required high accuracy in shape and dimensions and the considerable size of said parts are contrasting needs, which may be integrated only with a considerable cost increase.

OBJECT AND SUMMARY

An object of the invention is to provide a magnet structure having such a construction as to ensure a high accuracy in the fabrication of the individual parts forming it and a considerable reduction of fabrication costs.

The invention achieves the above objects by providing a magnet structure of the type described hereinbefore, in which at least the bearing structure and/or at least a part of the other construction elements are modular.

The bearing structure may comprise, for example, one or more plates, depending on geometry, which may be mutually fastened by fastening means provided in a predetermined position and adjustable by centering means.

The plates may be joined together in such a way as to obtain several configurations.

Generally, a closed annular structure may be obtained, in which the plates are connected in such a way as to form a rectangular or polygonal section, or an inverted U-shaped or C-shaped open structure. Here, at least one or two, or even three of the plates of which the closed annular structure is made may be used.

The bearing structure may advantageously form the yoke for enclosing the magnetic flux, whereas the magnetic flux itself may be generated by magnetic means of any type, attached to the inner and/or outer faces of the plates.

In accordance with a further characteristic, the means for generating the magnetic field may also have a modular structure. Especially, this modular structure has a limited number of basic pieces which, when combined together, form the means for generating the magnetic field, said basic pieces being advantageously dimensioned as preferably rational submultiples of the dimensions of the areas whereat they are attached to the plates which form the bearing structure.

A further improvement provides that the basic pieces of the means for generating the magnetic field may be further fastened to support bases, the support being as large as a rational submultiple which is greater than that of the basic elements, so as to form intermediate modular elements, i.e., comprising a certain predetermined number of basic pieces and designed to form the field generating element, in combination with other modular intermediate elements.

Particularly in permanent magnets, the field generating means have at least one pole, which is composed of one or more layers of basic pieces made of a permanently magnetized or magnetizable material, having the shape of parallelepipeds, with a very small number of different sizes, i.e., with a single standard size for most required basic pieces and with a very small number of special basic pieces.

In combination with said basic pieces, there are provided bases for supporting them, all of the same size, which size corresponds to a rational submultiple of the area whereat they are attached to the bearing structure, each of them being meant to bear a predetermined number of identical basic pieces and possibly a predetermined number of special basic pieces.

The material forming the basic pieces, of standard or special size, may be permanently magnetized prior to assembly or may be magnetized after the assembly of the bearing structure.

According to a further characteristic, the bearing structure and the field generating means or the modular elements composing them, or the bases for the intermediate modules may have means for preventive restrained joint attachment, providing at least one and/or, limited to predetermined tolerances, even two or three degrees of freedom. Said means may consist of undercut complementary guides, provided on the bearing structure and on the field generating means, or vice versa, or even restrained joints between adjacent modular elements which form the magnetic field generating elements.

A further characteristic of the invention consists in that the means for fastening the individual elements together may be positioned so as to allow direct access thereto from the outer peripheral sides of the bearing structure, in such a way that an easy and quick fastening action is allowed.

In combination with the above provisions, it is also possible to provide means for inserting parts of the magnet structure, which parts may be modularly assembled outside said structure, and attached thereto while being substantially joined together.

Thanks to the arrangements according to the invention, several different magnet structures may be provided with a very small number of construction parts, which may be used, at least partially, for the different possible configurations of the structure. All the modular elements may be easily fabricated in the form of bars or plates having multiple dimensions with respect to those of the individual pieces, which are obtained by being subsequently cut therefrom.

This is particularly advantageous for basic elements made of permanently magnetized or magnetizable material, which is very expensive and whose processing is also expensive. By providing that most of the field generating elements is composed of said basic elements, a considerably greater number of pieces is provided for one or only a few sizes, thus involving a reduction of the fabrication cost per piece and a considerable reduction of the unused materials in stock, which form an unused or anyway tied up capital.

The provision of the different configurations will substantially depend on the need to provide, besides the standard basic pieces shared by the different configurations, also a few special dedicated elements for integrating the standard basic pieces or other standard modular parts of the structure.

As for the quality of the magnetic field obtained therefrom, the modular construction involves no problem, since the possible tolerances, even as regards positioning, may destroy each other, or may be counted among the aberrations and errors found anyway in any type of structure with any type of construction.

Moreover, for example, with reference to the basic pieces made of a permanently magnetized or magnetizable material, even the possible dimensional tolerances causing the formation of interstices between said basic pieces have been observed to be without particular consequences for the field, especially when the support bases for the intermediate modules, if there are any, adhere to each other with dimensional accuracy.

In this case, it is even advisable to provide the basic pieces with such a size as to ensure that their assembly is always slightly smaller than the size of the support base for forming the intermediate module.

According to a further characteristic, the bases for supporting at least some of the basic pieces may be housed in a recess which is as thick as the associated plate of the bearing structure. Particularly, they may be made of the same material as the bearing structure.

In combination with, or alternatively to, each of the characteristics disclosed above, either individually, or in combination or subcombination with each other, the invention provides, for at least a part of the basic pieces, a housing in the form of a drawer, a box or channel-shaped or tubular member which is open and/or may be opened and closed at least on one side, or with at least one partially open side, and in such a way as to have tongues for retaining the basic pieces.

One embodiment provides that said case, drawer or channel is open on at least two end sides, and that said end sides may be at least partially closed.

A variant embodiment provides that said channel, drawer or case is only meant to be used as an inserting tool, which is taken off or anyway removed once the field generating modular elements have been positioned.

In accordance with a further advantageous characteristic, at least one plate made of a ferromagnetic material, the so-called pole, may be laid over the field generating modular elements, on the face opposite to the bearing structure part whereto the latter are attached, whereas said plate is kept in position by bridge supports, having hooks or fastening members engaged in seats parallel to the face of the plate which forms the pole in the corresponding side edge, and in seats parallel to the former, in the plate edge associated to the bearing or yoke structure.

Advantageously, the means for fastening the plate which forms the pole may comprise small plates laying over the corresponding side edges of the two plates associated to the pole and of the bearing or yoke structure, which are disposed parallel to and flush with each other, whereas said small plates may be fastened to said two plates by bolts, or similar fasteners.

A variant embodiment or an improvement provides that the plate which forms the pole is supported in such a way as to be movable perpendicularly to itself and independently for each end of the two fastening side edges. In this case the fastening small plates hold pivot pins in circular holes and are engaged in slots parallel to the faces of the plate which forms the pole by an eccentric end, whereas the bolts for fastening the small bearing plate to the plate which forms the pole are engaged in slots oriented transverse to the slots of the plate which forms the pole, i.e., substantially perpendicular to the faces of the plate which forms the pole.

In a further improvement, the pole may consist of two superposed plates, whereof one is fixedly fastened with respect to the rest of the structure, and the outer one may be inclined or moved by the means indicated above.

According to a further improvement, provided independently from or in combination with the above description, between the two superposed plates which form the pole a heating element is provided, which has the form of a thin panel and is fastened to the stationary plate, whereas one of the two plates has, on the face turned towards the other associated plate, a groove, a recess or more grooves or recesses for hideaway housing of a temperature sensor and conductors for connection thereof.

From the above description the advantages of the present invention are self-evident. Thanks to the characteristics indicated individually or in combination, a modular magnet structure is obtained, which is easy to assemble with the required accuracy and which requires the fabrication of a very small number of different construction parts, all this making the magnet structure effectively less expensive.

Further improvements of the invention will form the subject of the dependent claims.

BRIEF DESCRIPTION OF THE DRAWINGS

The characteristics of the invention and the advantages derived therefrom will be more apparent from the following description of a few embodiments illustrated not by way of limitation in the accompanying drawings, in which.

DETAILED DESCRIPTION OF THE PREFERRED EMBODIMENTS

Figure 1:
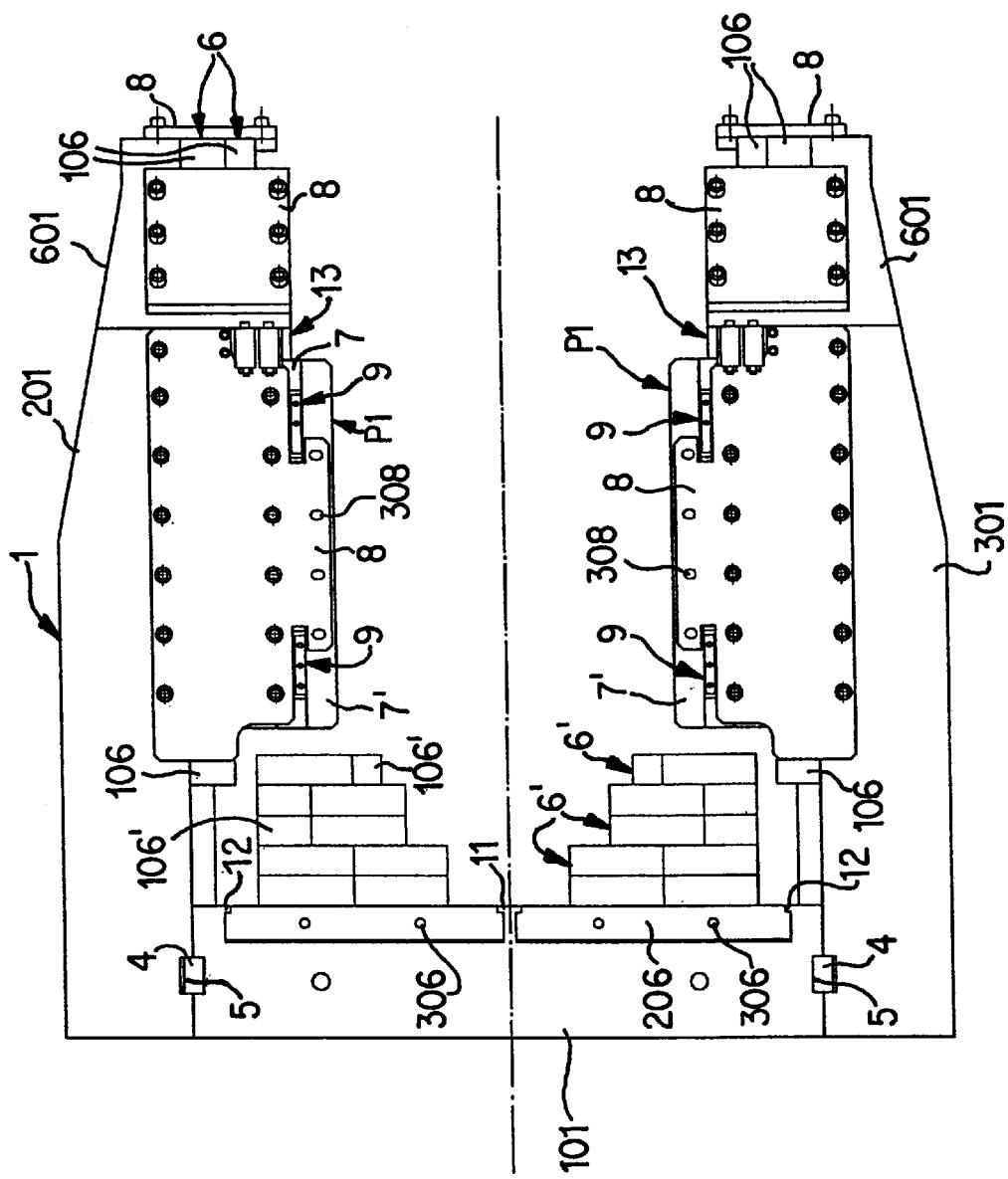
FIG. 1 is a side view of a magnet structure for a permanent U-shaped magnet according to a first embodiment of the invention.
Figure 2:
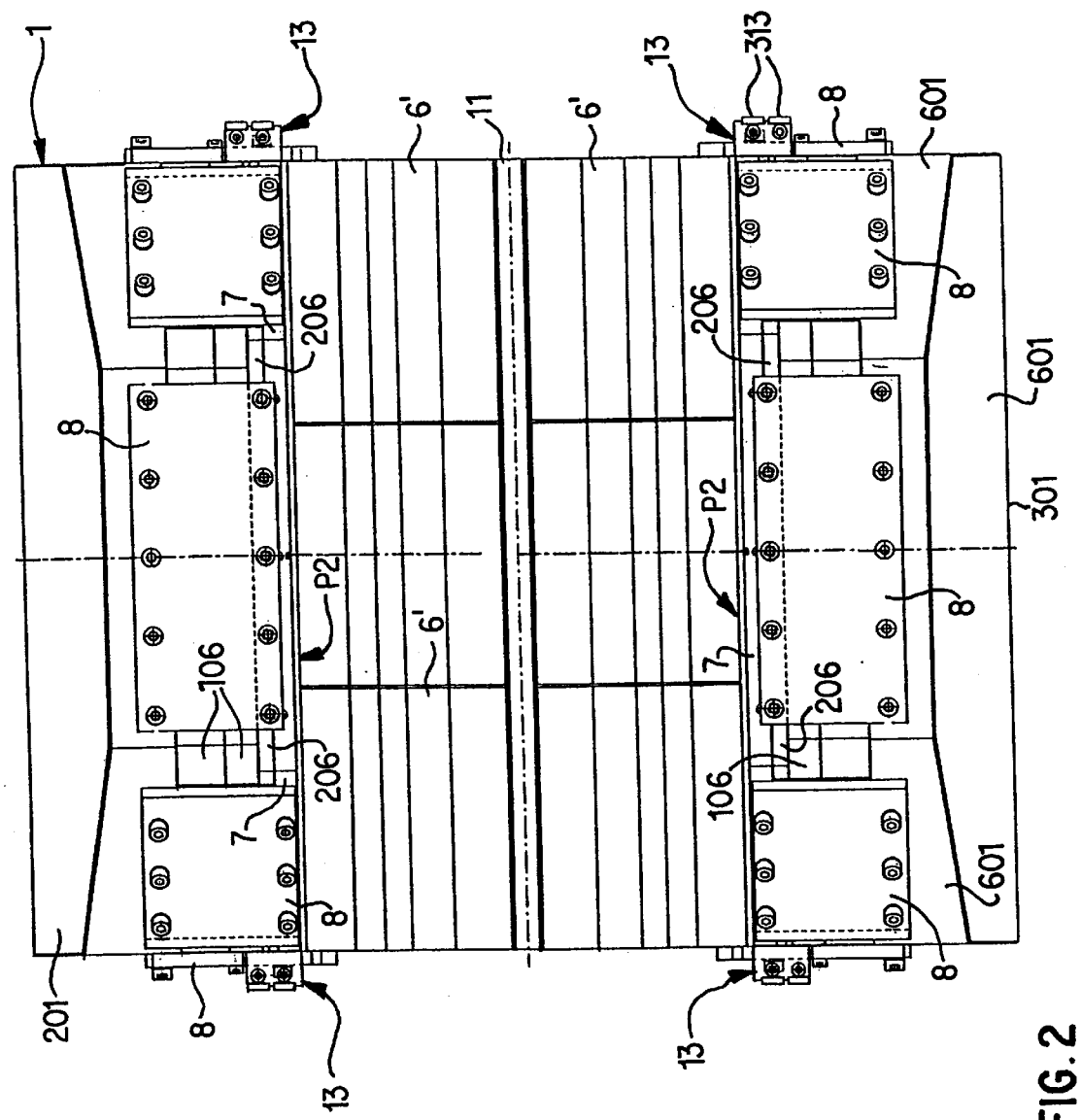
FIG. 2 is a front view of the magnet as shown in FIG. 1.
Figure 3:
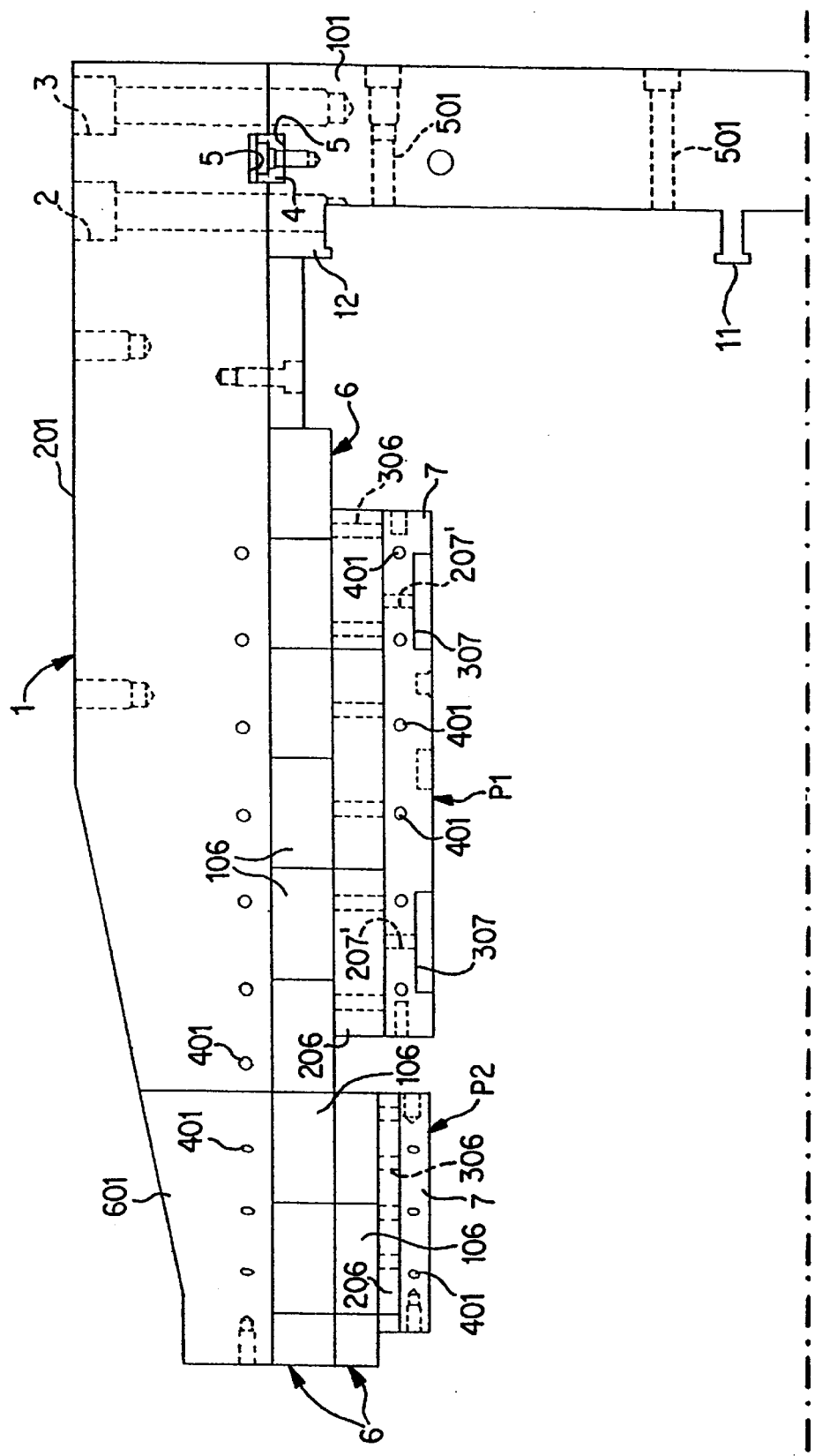
FIG. 3 shows an enlarged detail of the upper half of the structure as shown in the preceding figures in an intermediate construction step.
Figure 4:
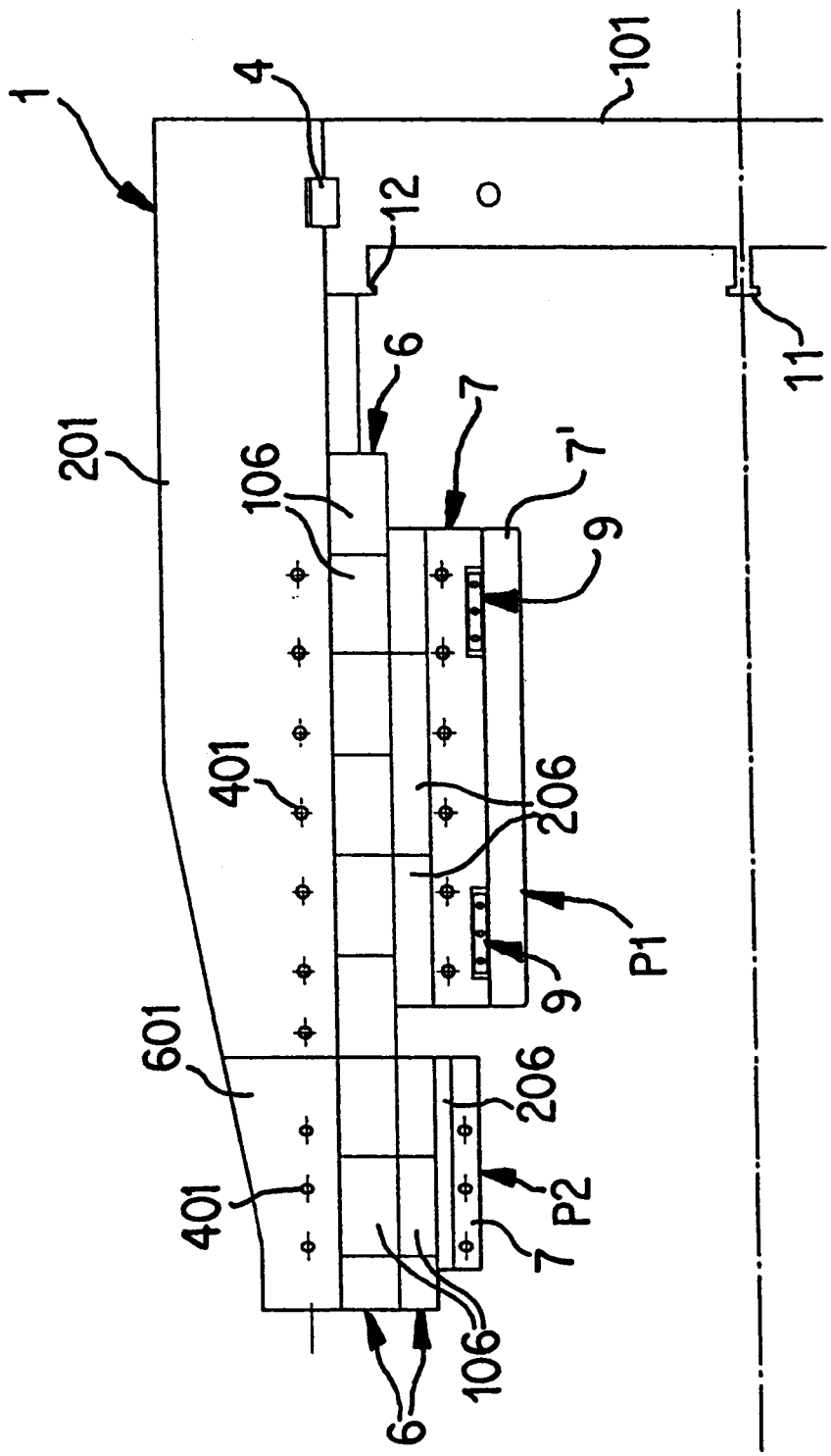
FIG. 4 is a view like that shown in FIG. 3 in a different assembly step.
Figure 5:
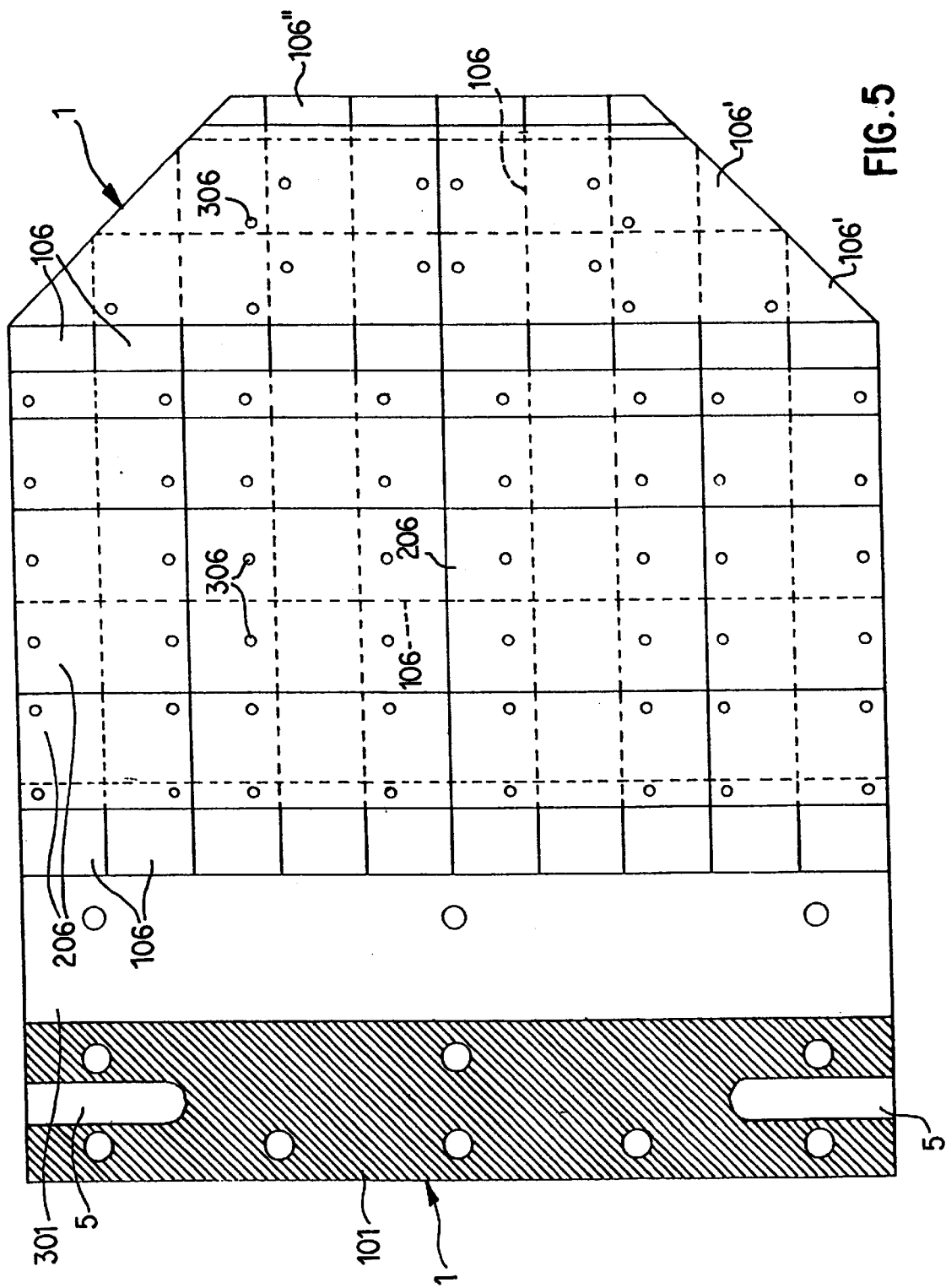
FIG. 5 is a top plan view of a layer of bricks made of magnetized or magnetizable material.
Figure 6:
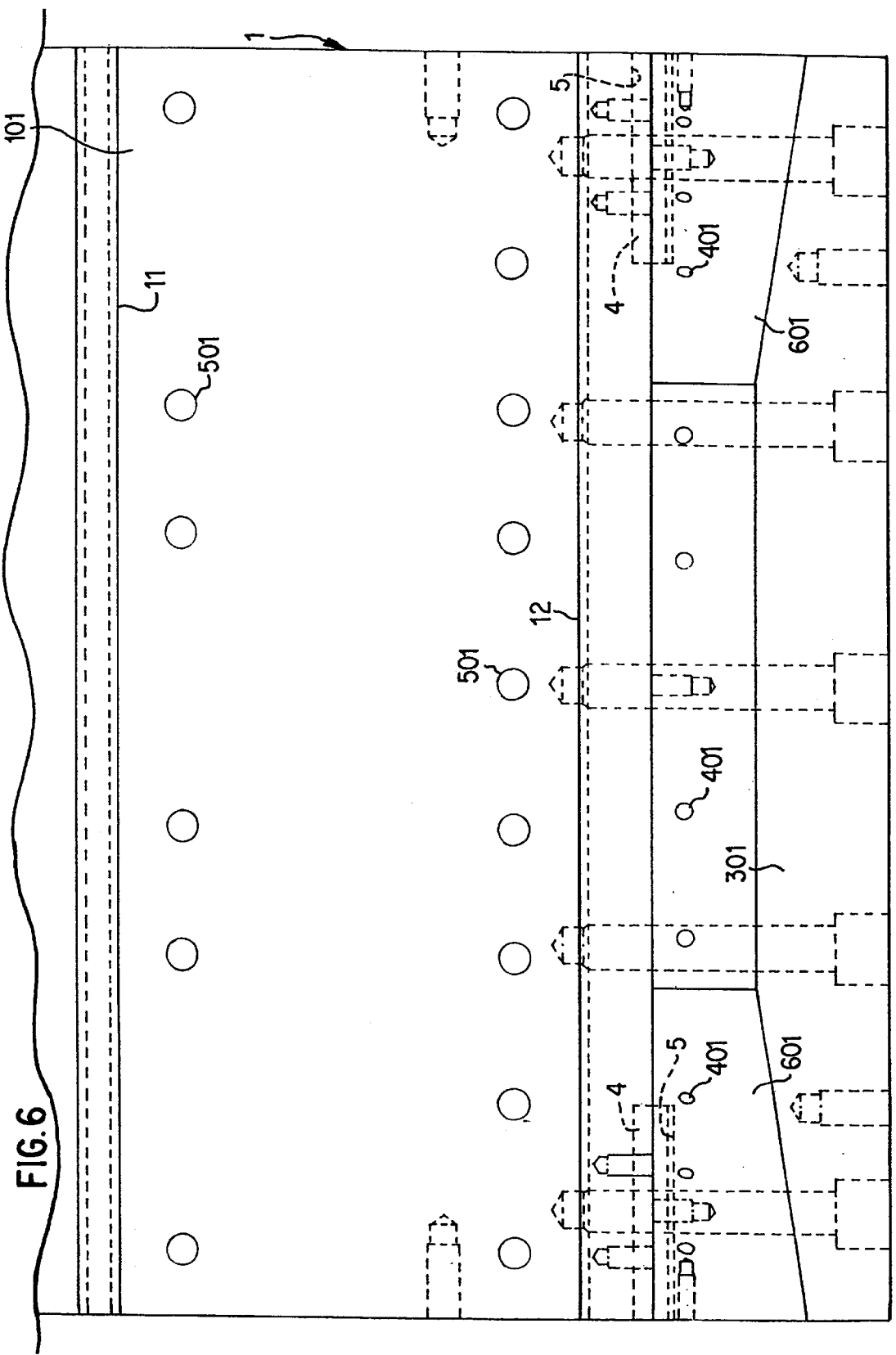
FIG. 6 shows an enlarged detail of the lower half of the magnet structure as shown in the preceding figures, wherein only the plates which form the yoke are provided.
Figure 7:
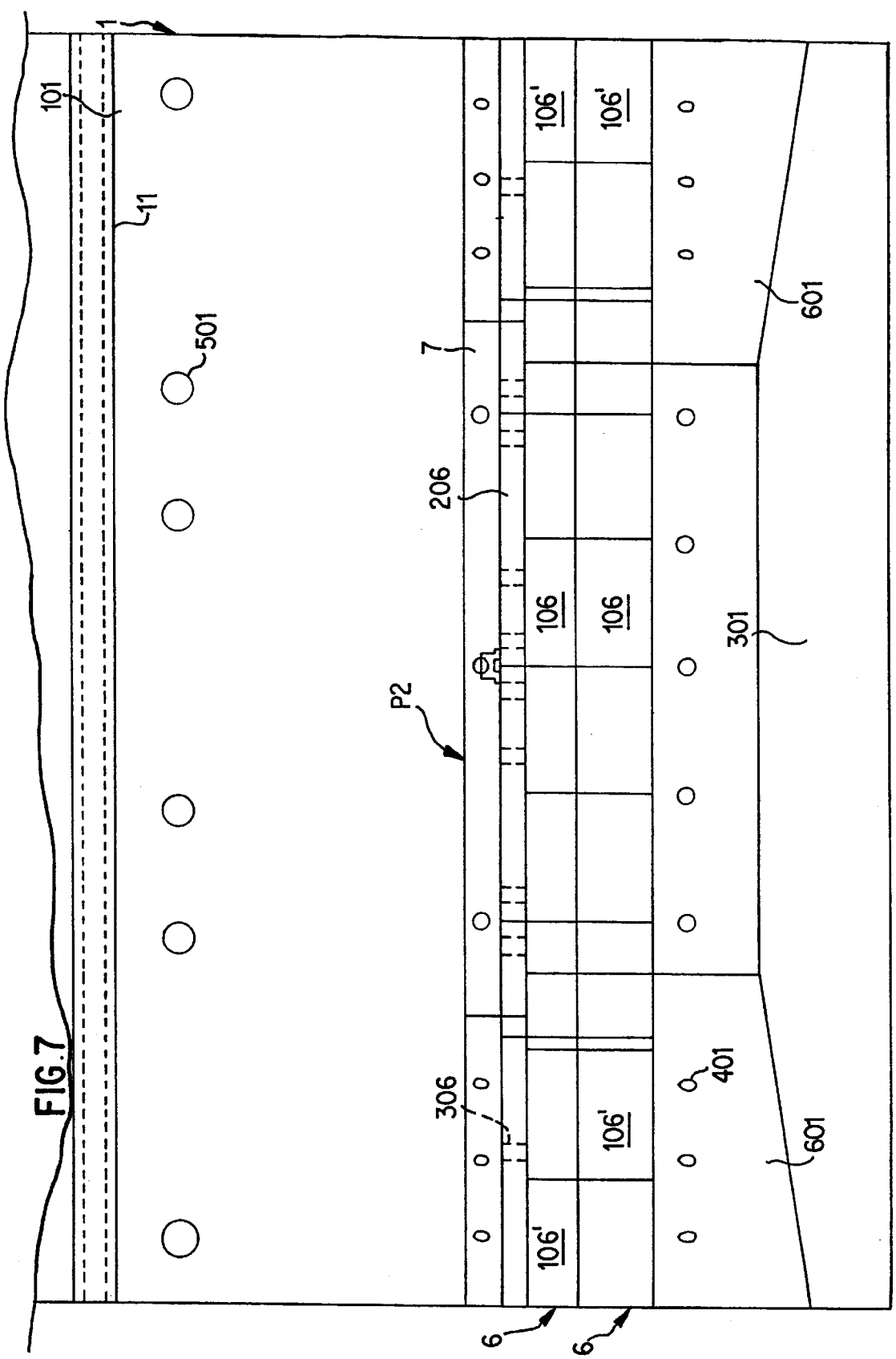
FIG. 7 is a view like that shown in FIG. 6, with the addition of the layers of bricks made of magnetized or magnetizable material.
Figure 8:
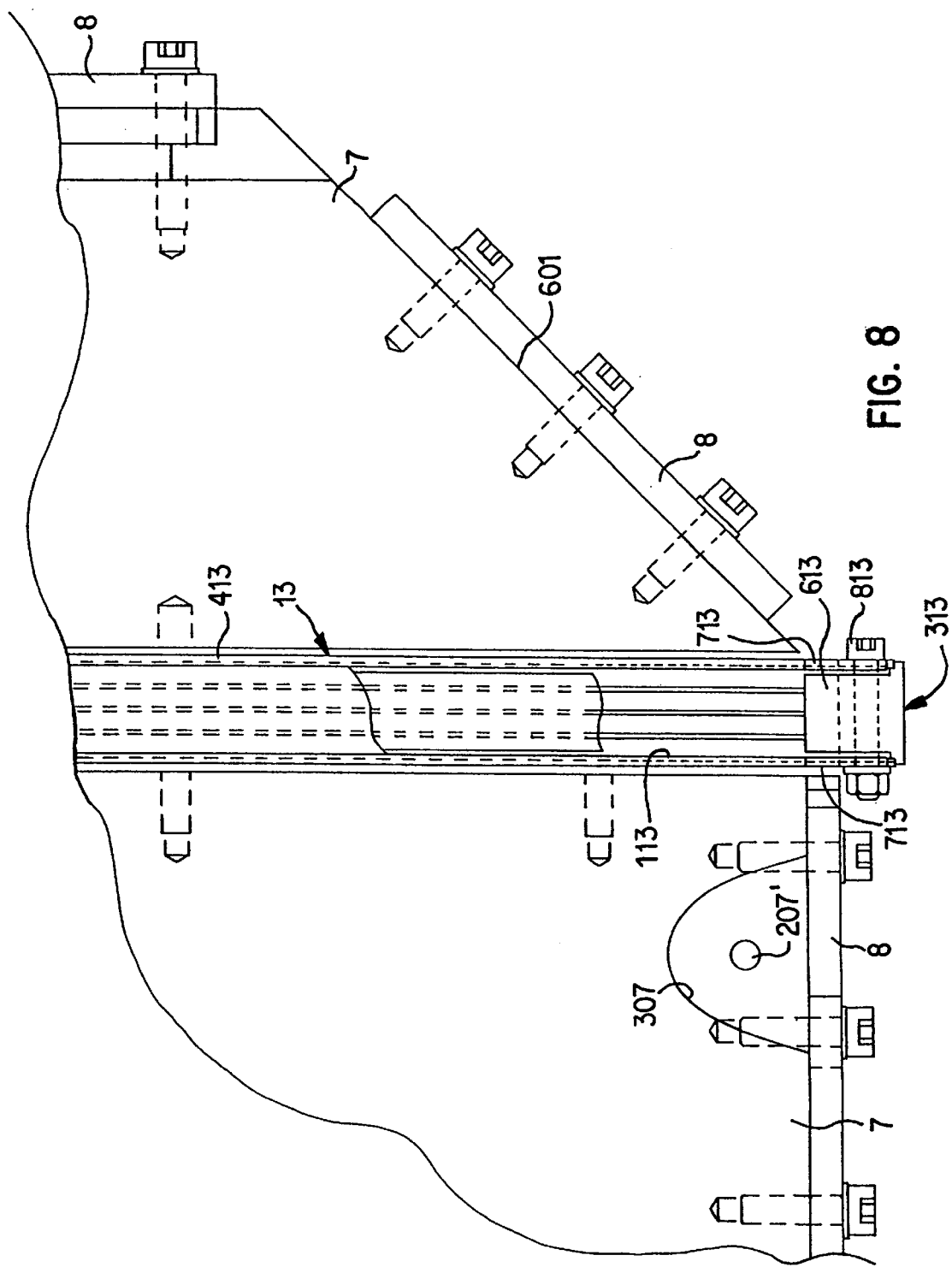
FIG. 8 is a plan view of an enlarged detail of an upper or lower part of the plate which bears the magnetized or magnetizable material associated to the main pole and to the secondary pole and with an interposed element in accordance with a first embodiment.
Figure 9:
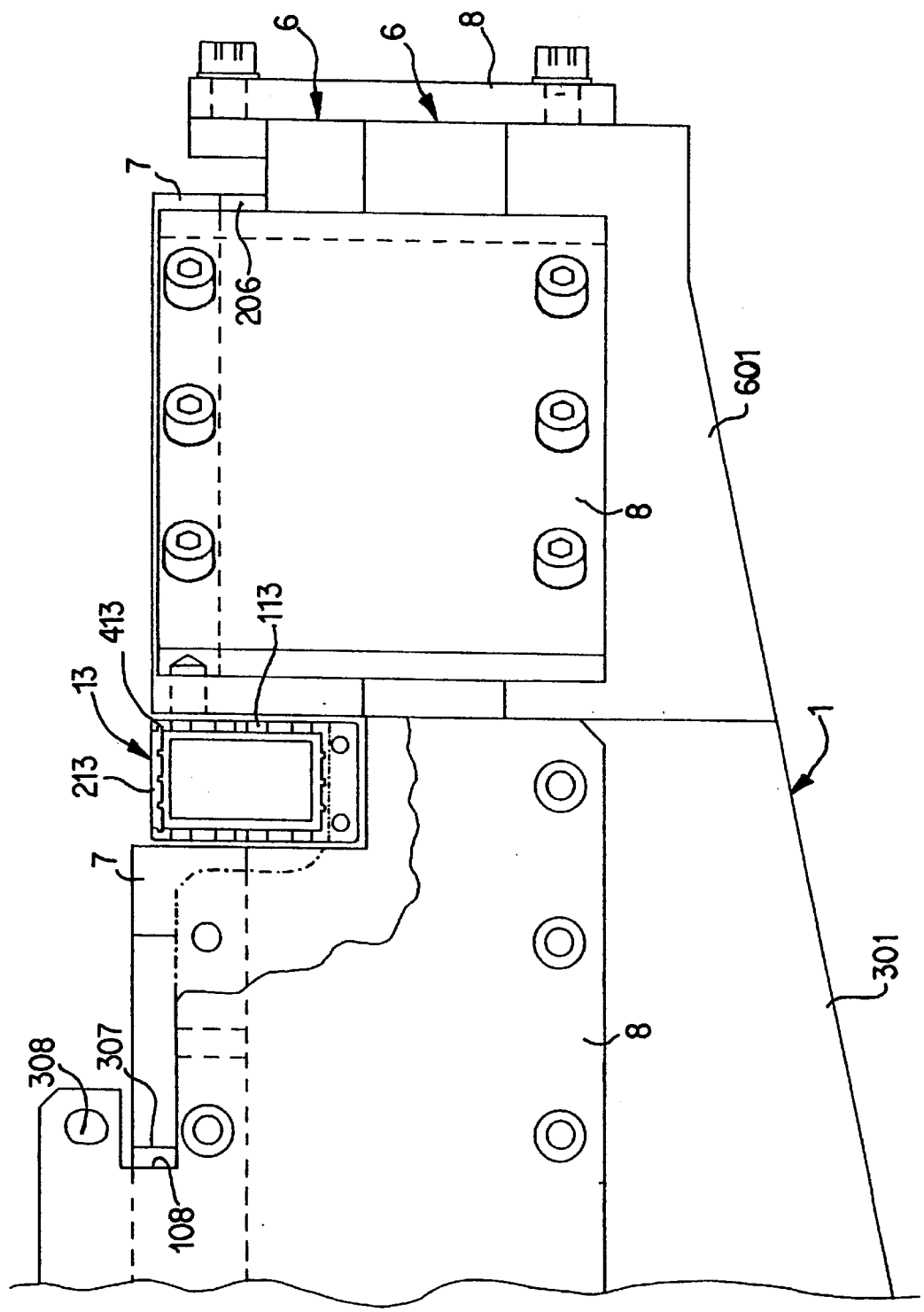
FIG. 9 is a side view of the detail as shown in FIG. 8.
Figure 10:
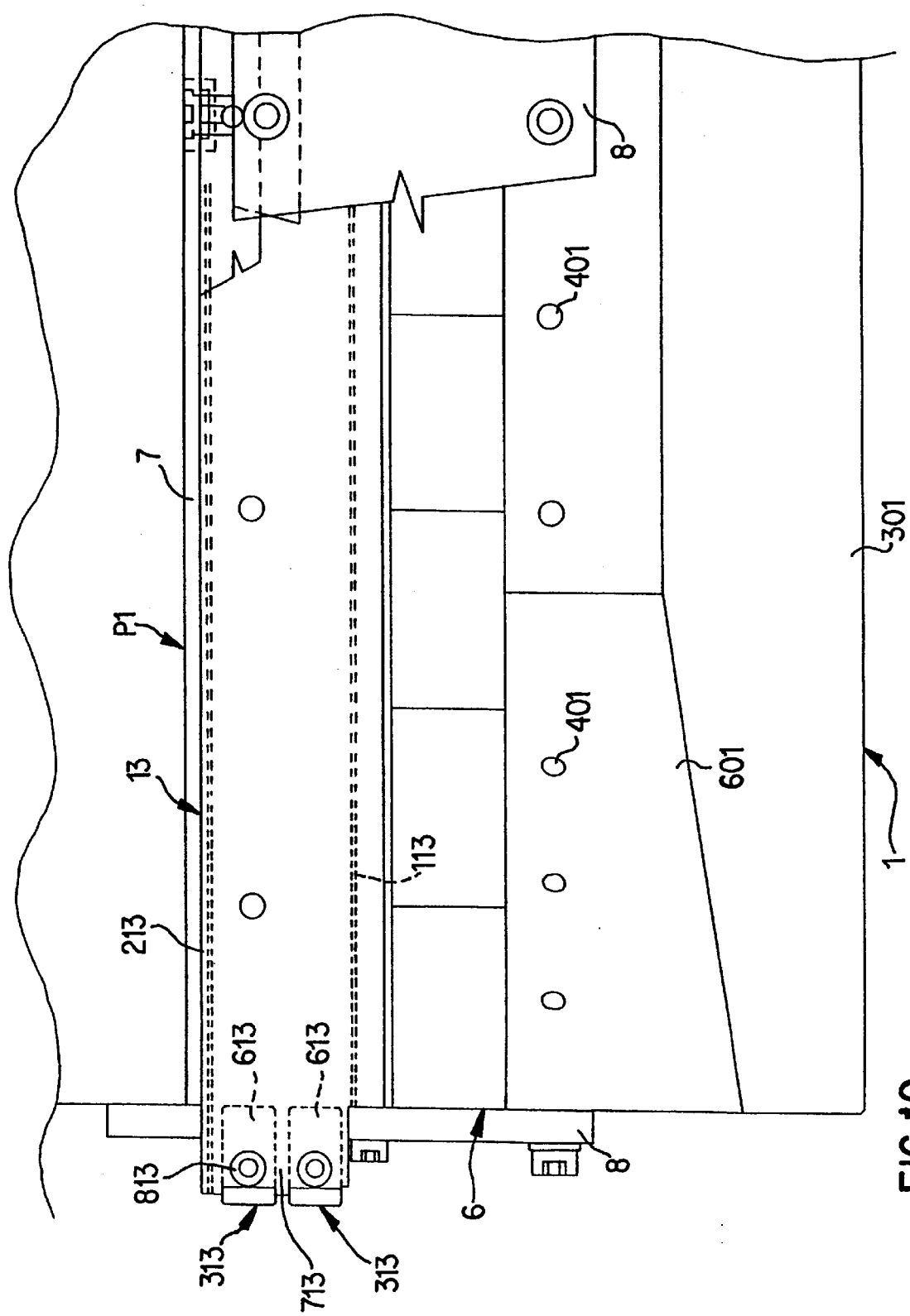
FIG. 10 is a front partially sectional view of the detail as shown in FIGS. 8 and 9.
Figure 11:
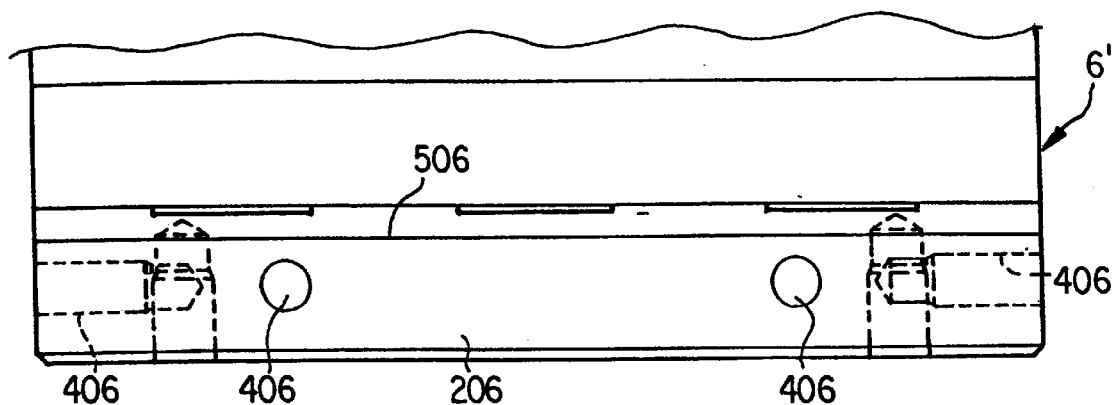
FIGS. 11 and 12 are two views of the detail of the magnetized elements associated to the vertical plate of the yoke.
Figure 12:
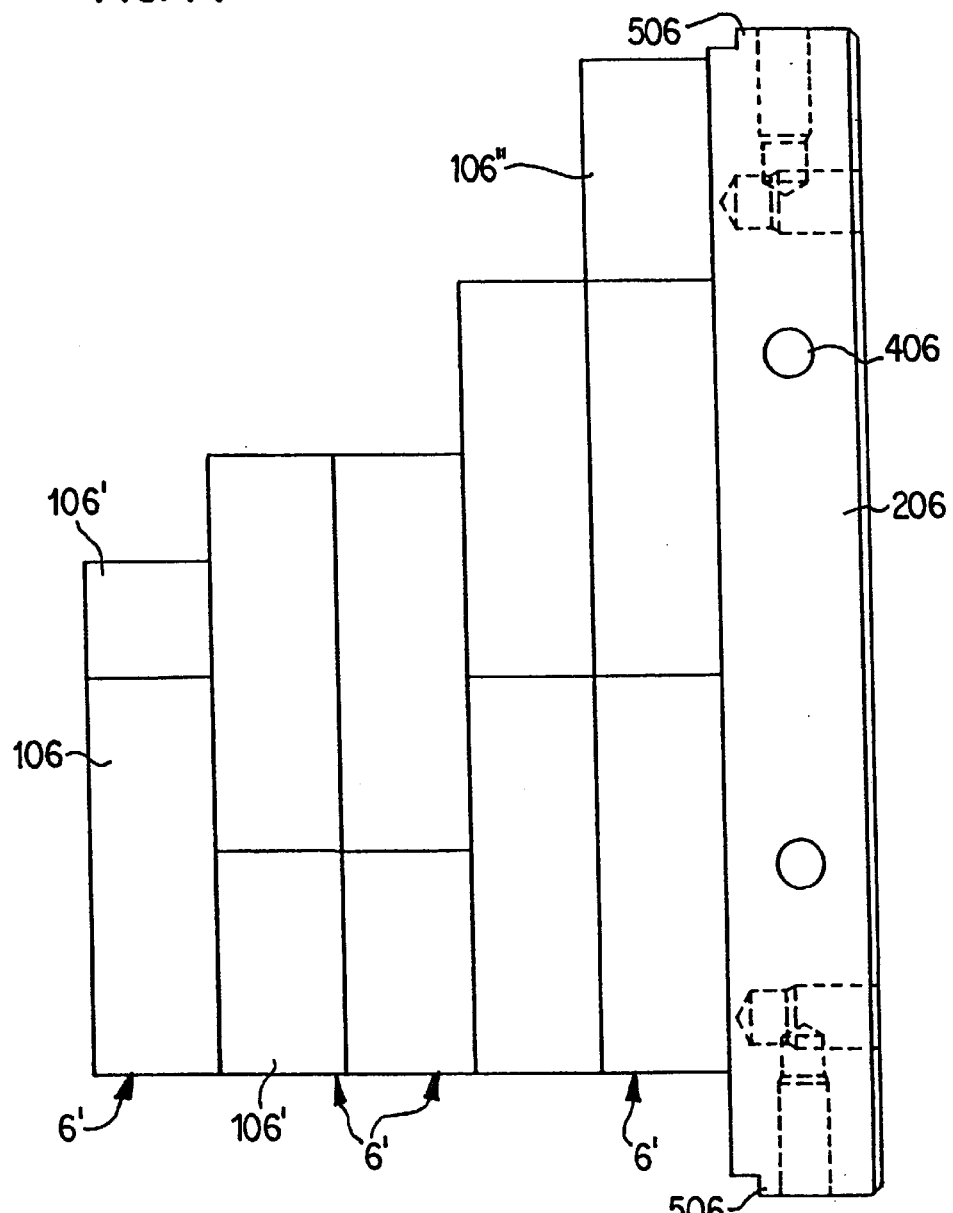

The examples shown in the accompanying figures are not to be intended by way of limitation, particularly as regards the combination of construction arrangements. Different construction variants may be provided individually or in any compatible combination, regardless of the expressly shown combinations.

With reference to FIGS. 1 to 14, a magnet structure for a permanent magnet designed for Nuclear Magnetic Resonance comprises a bearing structure 1, which has a modular construction and is comprised of plates 101, 201, 301, having predetermined mutual fastening means 2, 3 and mutual centering and/or positioning means 4, 5.

The bearing structure 1 forms a magnet yoke and is made of a high-permeability material. The structure as shown in FIGS. 1 to 14 is U-shaped, with three open sides three plates 101, 201, 301 may be fastened in such a way that two are parallel to each other (201, 301) and the third (101) is transverse, i.e., perpendicular thereto. By this arrangement, a cavity substantially having the shape of a right parallelepiped or of a cube is provided.

The centering means consist of grooves 5 on the planar contact sides between the plates 101, 201, 301, and which are provided in coincident positions and are meant to hold centering bars 4 having complementary cross sections. Particularly, since the relevant positioning orientation is parallel to the two parallel plates 201, 301, the grooves, as well as the centering bars 4, have a rectangular cross section.

Each of the two parallel plates 201, 301 is intended to bear on its inner face, turned towards the opposite plate, one or more layers of magnetized or magnetizable material, indicated altogether as 6. On the layers of magnetized or magnetizable material 6 there are provided the poles, which include plates, also made of a high-permeability material. The structure shown in the figures has, on each parallel plate 201, 301, a main pole P1 and a secondary pole P2.

The layers 6 of magnetized or magnetizable material consist of a plurality of bricks 106 of standard sizes, which are glued to each other and to bases 206 made of a high-permeability material. The bases 206 are smaller than the area of the plates 201, 301 to be covered with the layer of magnetized or magnetizable material 6 and are intermediate modules which may be prefabricated separately from each other outside the structure 1, and then attached, each in its position, on the corresponding plate. The individual intermediate modules are attached to the plate by means of through bolts, inserted in holes 306 of the bases 206, and engaging in threaded holes of the corresponding plate 201, 301. As is apparent from the figures, particularly from FIGS. 3 and 4, this construction also applies to the secondary pole P2 on the open side of the structure, parallel to the plate 101, with the difference that at the secondary pole P2, the bases 206 bear a double layer of bricks 106, the first layer being substantially as thick as the bricks 106, of the layer associated with the main pole P1, whereas the second layer is composed of thinner bricks.

The bases 206 may be provided with means for grasping the bases 206 by tools, in order to move or handle them. These means are shown, by way of example, in FIGS. 11 and 12 and are indicated with numeral 406. They are provided in the form of pairs of notches or holes, allowing the insertion of the teeth of a grasping fork of a handling tool.

The bases 206, which are disposed at a distance from their respective yoke plates 201, 301 form together a first layer of the main pole P1 and of the secondary pole P2.

The main pole P1 and the secondary pole P2 each have an additional layer, formed by a plate 7. The main pole P1 has, unlike the secondary pole P2, an additional plate 7', laying over the first plate 7. The plates are made of a high-permeability material, preferably of the same material as that forming the bases 206.

The plates 7, 7' which form the poles P1, P2, are at their peripheral edges parallel to and flush with the side edges of the plates 201, 301 which form the yoke 1 and are attached thereto by means of small fastening plates 8, laying over said side edges of the plates 201, 301 which form the yoke and of the plates 7, 7' of the poles P1, P2, by means of bolts, engaging through holes formed in the small fastening plates 8, in threaded holes 401 formed in the plates 201, 301, 7, 7'.

With reference to the modular construction of the layers 6 of magnetized or magnetizable material, the bricks of said material consist of a certain number of pieces of standard sizes 106, 106", and of a certain number of special basic pieces 106', which are necessary to fit particular geometrical shapes of the structure. Particularly, in the example shown in the figures, these special pieces 106', are required for corner areas on the open side parallel to the plate 101. These areas have flattened surfaces and therefore, in these locations, triangular bricks 106', are required. The bases 206 in these zones also must have special shapes. As will be apparent from a variant embodiment, providing that the structure is suitably dimensioned, the number of special pieces required for the construction of the structure may be considerably reduced.

Where the flattened surfaces 601 are provided, the plates 7 which form the secondary poles P2 also have to be appropriately shaped.

Figure 13:
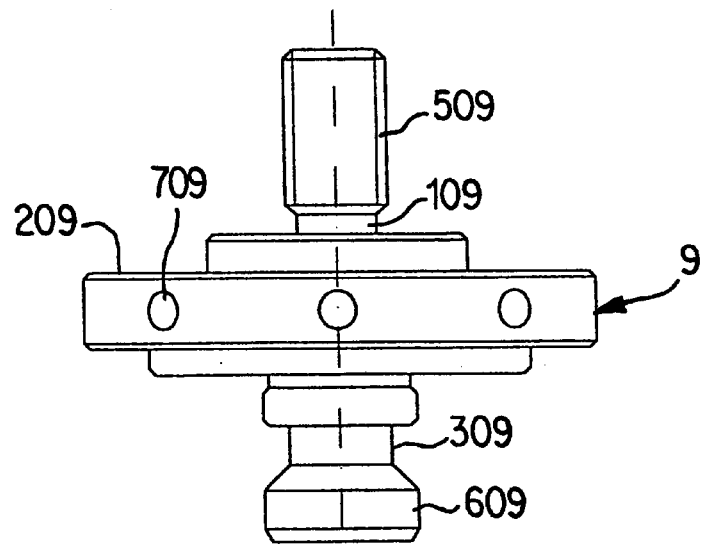
FIGS. 13 and 14 show two details of the means for adjusting the inclination of the main pole formed by the two superposed plates.
Figure 14:
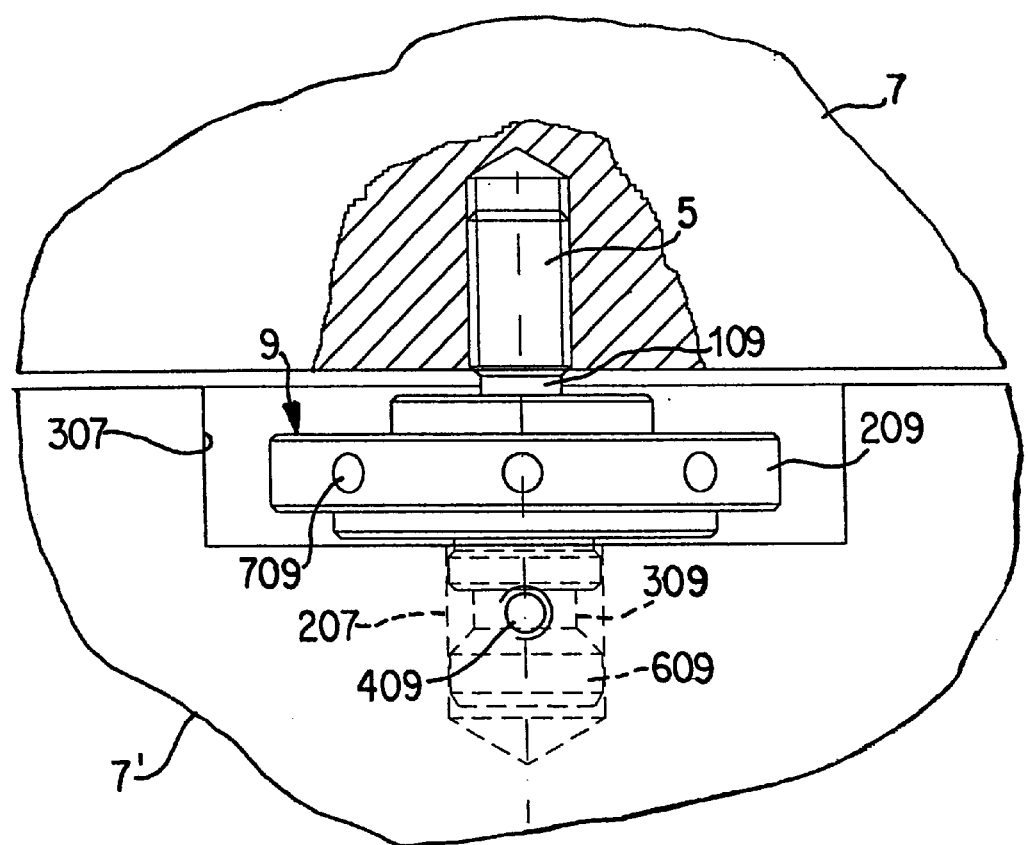

Still referring to the first example, as shown in FIGS. 1 to 14, and particularly referring to FIGS. 13 and 14, the second plate 7' forming the main poles P1 is fastened to the first plate 7, which is fixed, in such a way as to be movable and adjustable as regards inclination. To this end, in the four corner areas of the two plates 7, 7', there are provided means 9 for adjusting the distance between said two plates 7, 7', comprising a pivot 109, with an axial drive wheel 209. The pivot projects axially out of both faces of the drive wheel 209. One end 609 thereof has an annular coaxial throat 309 and is engaged in a hole 207 of the stationary plate 7, while it is retained therein against by a removable radial tooth, for example, a radial threaded dowel 409, mounted in a radial threaded hole of the movable plate 7', in such a position that it may allow access from the outside, and which hole opens into the hole wherein the pivot 109 is engaged. By this arrangement, the pivot may be locked for preventing it either from disengaging from the housing hole or from rotating inside said engaging hole.

The opposite end 509 of the pivot 109 is threaded and engaged in a coincident threaded hole 207' in the stationary plate 7.

The drive wheel 209 has a greater diameter and is housed in a recess 307, which is open on the corresponding side edge of the stationary plate 7. The position of the pivot 109 in the engagement position is such, that the drive wheel may be accessed laterally from the outside, the small fastening plate 8 being provided with apertures 308 for access to the wheel 209. The latter also has means for grasping it, such as radial holes 709, allowing the engagement of a driving tool, knurls, or similar.

At the side edge of the plate 7' of the main pole P1, the lateral small fastening plates 8 may have, instead of simple through holes, slots 108, which are oriented towards the motion of the plate 7', i.e., perpendicularly to the faces thereof.

With reference to the example as shown in FIGS. 1 to 14, the vertical plate 101 of the yoke 1 bears, on its inner face, layers of magnetized or magnetizable material 6, which also consist of modules, with a base 206 whereto several layers of bricks 106, 106', 106" are attached by gluing. In the illustrated example, the bases 206 are made of a high-permeability material, for example of the same material as that forming the plate 101 of the yoke 1 whereto they are attached. Moreover, unlike the modules associated with the poles P1, P2, here the bases 206 are provided directly in contact with the bearing plate 101.

Also in this case, bolts are used for fastening, although they are engaged in threaded holes formed in the bases 206, from the outer side of the plate 101 of the yoke 1 through holes 501.

This embodiment has the considerable advantage that there may be provided means for engagement of the modules of the plate 101, which consist of undercut guides 11, 12 having an appropriate section, for example, as shown, a L-shaped or T-shaped section, wherein complementary ribs 506 or teeth or sequences of teeth provided on the bases 206 are engaged. Since the bases are generally made of a ferromagnetic material, which allows for easy processing, this arrangement may be implemented in a simple and inexpensive way. If particular and complex shapes were to be provided for the bricks made of the magnetized or magnetizable material 106, much higher costs would be involved, given the expensiveness of the material and of the formation and processing of bricks.

The bricks 106 are also provided in a certain number of standard basic pieces, whose combination ensures the formation of the desired shapes.

With reference to a further characteristic which, in the illustrated examples, includes a magnetized or magnetizable element 13, interposed between the main poles P1, P2, the modular elements whereto the basic bricks made of the magnetized or magnetizable material are associated may also be box-, channel- or drawer-like members.

In the illustrated embodiment, the interposed element 13 consists of a box formed by a U section 113, having a removable lid 213 and removable end sides 313. The lid 213, which may be fixed in any way, is provided, in the illustrated example, with longitudinal lateral tongues 413 for the sliding engagemement, from one or both end sides with the U channel 112, of lateral tongues 713, formed on the inner sides of the channel 113, along the free edges thereof. The ends 313 includes blocks 613, which are interposed between said two lateral tongues 713 of the channel 113, and are fastened by means of threaded pins or through bolts 813, which pass through the blocks 613 and the lateral tongues 713, clamping them together.

FIGS. 15 to 25 show embodiments provided alternatively to the example described and illustrated in FIGS. 1 to 14.

Figure 15:
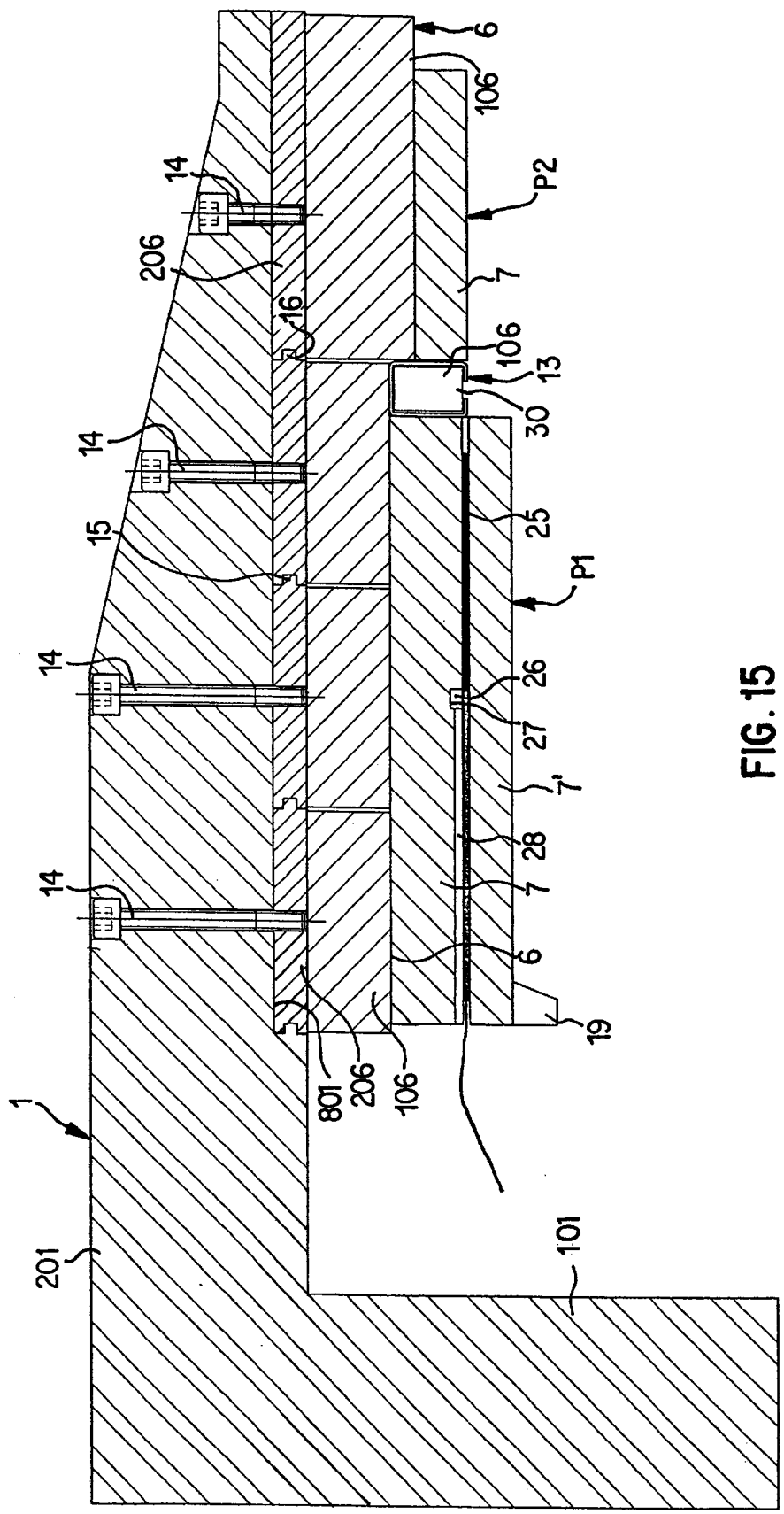
FIG. 15 shows a section with respect to a transverse, vertical median plane of a U-shaped magnetic structure according to a variant embodiment.

FIG. 15 is a schematic view of a first variant, in which the modules which form the layer or layers 6 are made according to the principle that the modules are associated to the plate 101 of the yoke 1 or of the bearing structure 1, that is with the bases 206 being provided on the side in contact with the associated plates 201, 301. In this case, the bases 206 are held in a recess 801 formed in the corresponding plates 201, 301, which has appropriate shape and size, i.e., proportionate to the set of modules 306, that is of bases 206, since the latter are a dimensional rational submultiple of the areas whereat they are attached to the plates 201, 301. Further, the bricks made of the magnetized or magnetizable material are made of such sizes as to be integral submultiples of the module bases.

As is apparent from FIG. 15, in this case the bases are part of the yoke 1, and may be fastened thereto by means of bolts 14, engaging in threaded holes, formed in the bases, from the outer sides of the corresponding plates 201, 301 of the yoke 1, and through holes formed therein.

This also allows to provide removable restrained joint means, leaving the same degrees of freedom in mutual displacement, as those provided on the plate 101 for the associated modules of the magnetized or magnetizable material. In FIG. 15, said restrained joint elements consist of grooves 16 and ridges 15 only on the side edges of the bases in contact with each other and with the side walls of the housing setback.

Figure 16:
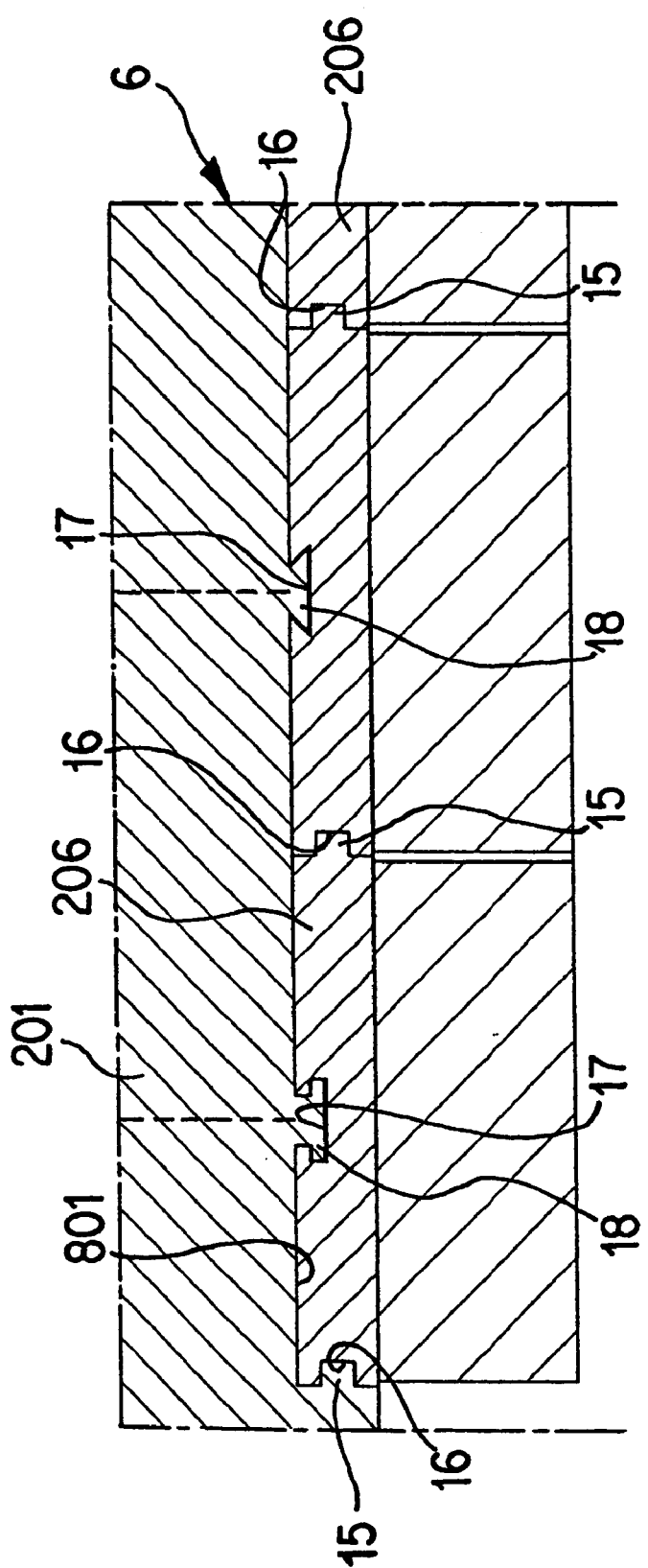
FIG. 16 shows a detail of the preventive restrained joint between the modules forming the layer of bricks made of a magnetized or magnetizable material.

The variant of FIG. 16 shows, in combination with the restrained joint elements 15, 16, also hook-like elements 17, 18 consisting of undercut ribs, for example dovetail-shaped, or with widening ends protruding out of the contact surface of the inner face of the plate and of complementary grooves for engagement in the bases 206, or vice versa. There may be provided a guide for each line of modules 306, which extends from side to side of the plate 201, 301 of the yoke, whereas the grooves have open ends and the bases may be slipped on the guides 18. In this manner, an advantage is provided, in that the assembly operations are easier, since each module, having a considerable weight, is temporarily retained against the plate 201, 301, allowing to optimize positioning operations by sliding, and positioning tolerances transverse to the guides 18, before locking the modules against their respective plates 201, 301.

The embodiment of FIG. 15 includes a further variant, consisting in that no magnetized or magnetizable modules are provided on the plate 101 of the yoke. These modules are functionally replaced by an inner trapezoidal rib 19 along the edge corresponding to the main poles P1 and protruding out of the free face of the poles P1 towards the opposite pole.

The pole preferably has a square, or anyway rectangular shape, so as to provide that the bases 206 and the bricks are also in the form of rectangular or square plates. This provides easier and cheaper fabrication operations.

In accordance with a further characteristic, which may be also provided in combination with the previous embodiment, shown in FIGS. 1 to 14, a magnet quality within the range of field aberrations comparable to those aberrations anyway caused by construction tolerances, and removable in a subsequent calibration step known as shimming, has been found to be obtainable with no need for very high dimensional tolerances as regards plan dimensions. In this case, the critical tolerances are those of the bases 206, which are to be perfectly adherent to each other. The bricks may also have little interstices between each other. To this end, the brick sizes are selected in such a way that the fabrication tolerances involve such maximum sizes as to keep the set of bricks on each module within the dimensional limits of the corresponding base, without projecting out of it.

The main poles P1 consist in this case of two plates 7, 7', one of which is stationary and the other may be inclined with respect to the stationary one. The stationary plate is kept in position, as described in the previous example, by lateral fastening plates 8, which are fastened by one end to the plates 301, 201 of the yoke 1 and at, the opposite peripheral edge of the stationary plate 7', they are fastened thereto. The inclinable plate 7 is hooked to the two opposite fastening plates by lateral teeth engaged in lateral notches of the plate 7' through holes 108 of the fastening plate.

The means for retaining the inclinable plate 7' are in this case the means for adjusting the inclination of the inclinable plate 7'. Said means consist, for example, of pivots 20, mounted in such a way as to rotate in rotation supports 21 which may be fixed to the fastening plates 8, through holes formed therein. The pivots 20 have one end turned towards the edge of the inclinable plate 7' and bearing an axial eccentric appendix 120, projecting out of said end and engaging in a slot 507 which is oriented parallel to the direction of displacement of the plate 7', i.e., in this case parallel to the faces thereof. The opposite end projects out of the seat and has non-round means, indicated as 220, for grasping or rotatable coupling with a tool and means for locking in the desired angular position, which means may be of any type, in this example consisting of an exterior thread 320 of the pivot 20, cooperating with a nut screw 22 whereas, at the end of the pivot 20, bearing the eccentric appendix 120, there is provided a radial shoulder 420, which abuts against a radial abutment 121 of the rotation seat 21.

Figure 24:
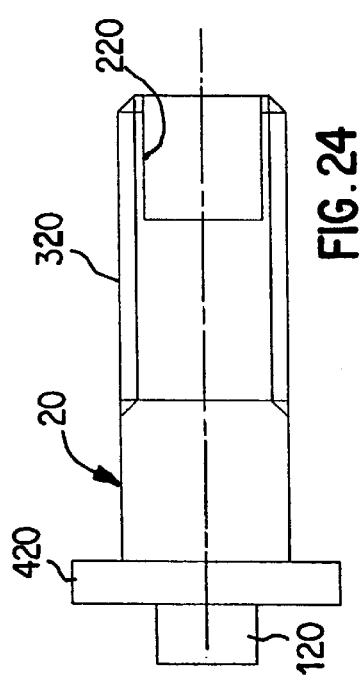
Figure 26:
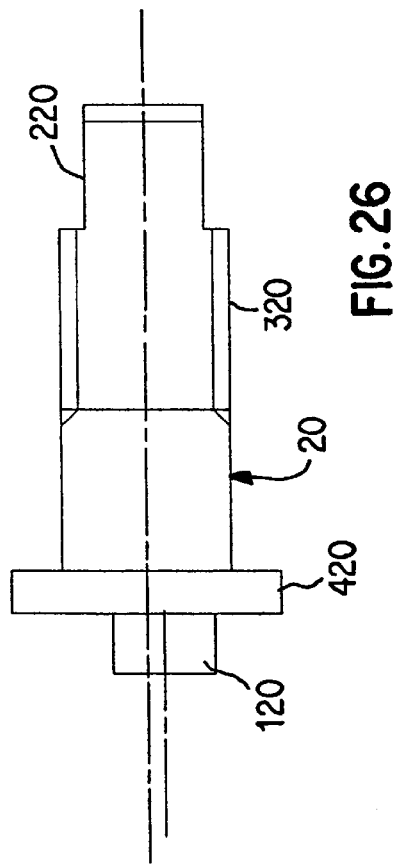
Figure 23:
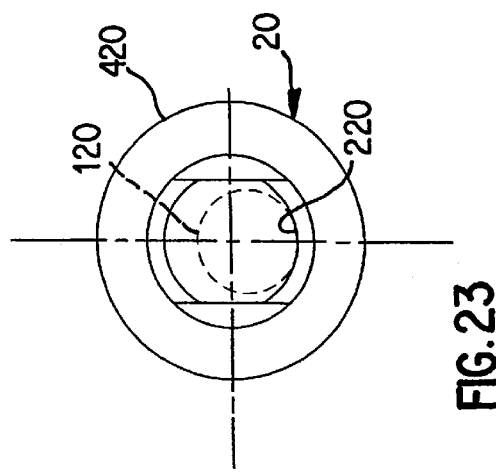
Figure 27:
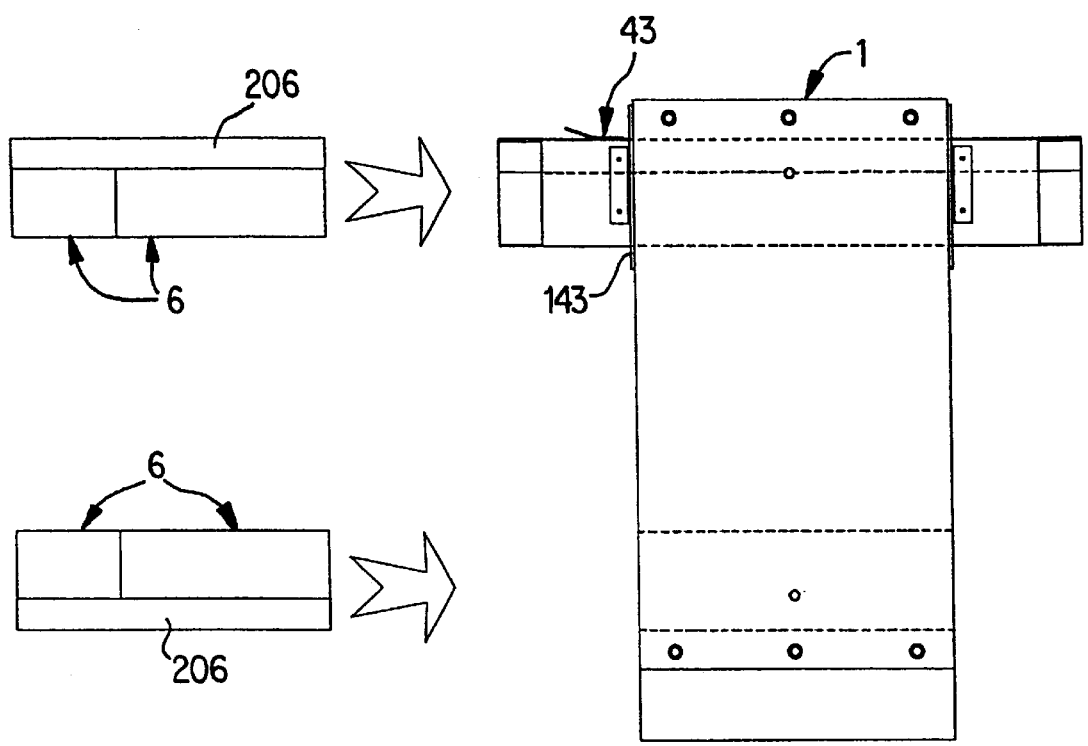
FIGS. 27 to 32 are different views of an annular magnet structure with removable means for assembling the magnetized or magnetizable elements.
Figure 28:
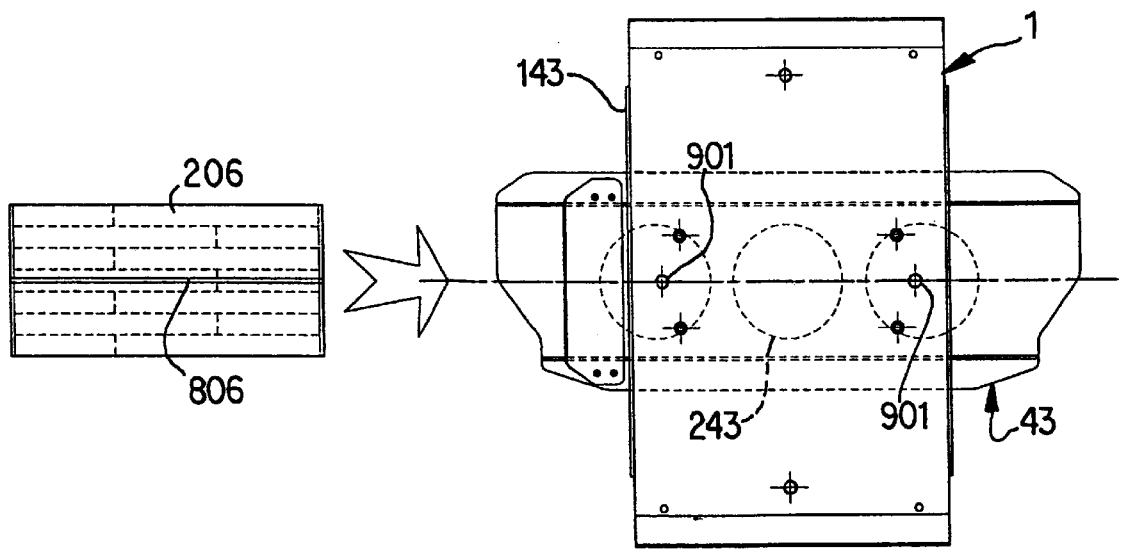
Figure 29:
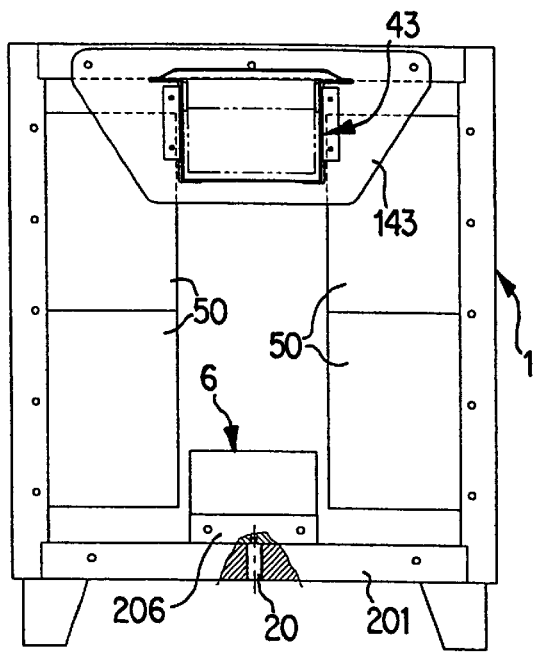
Figure 30:
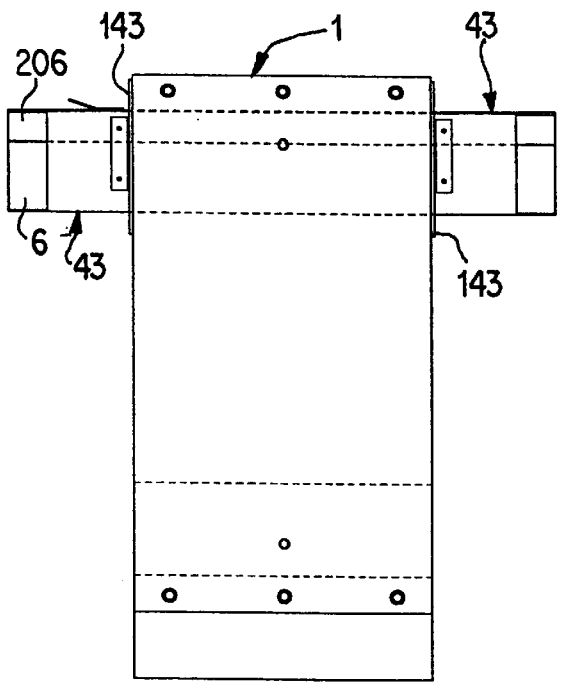
Figure 31:
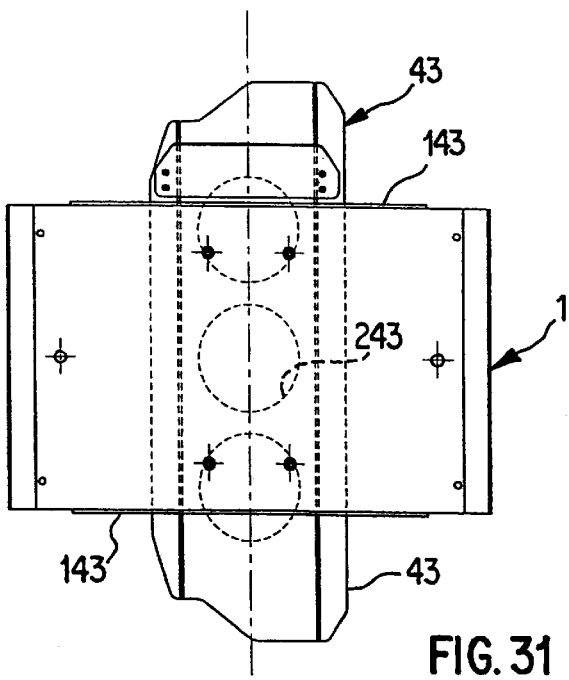

In order to properly adjust the inclination of the plate 7' with respect to the plate 7, there is provided an adjusting device of the type described above, at least at the four corner areas of the inclinable plate 7', i.e., of the two opposite ends of the lateral edge thereof, cooperating with the two fastening plates. In FIG. 16, for each lateral fastening plate there are provided three adjusting devices of the type described above. An example of the above adjusting means is shown in FIGS. 20 to 26. FIG. 24 shows means for rotatable coupling with a tool in the form of a socket head screw, or similar, which consist of a non round notch in the outer end side of the pivot 20.

Obviously, as disclosed above for the previous variant embodiment, this arrangement may be also provided in combination with an embodiment as shown in FIGS. 1 to 14, alternatively to the means for adjusting the inclination of the inclinable plate 7 described herein and vice versa.

Figure 18:
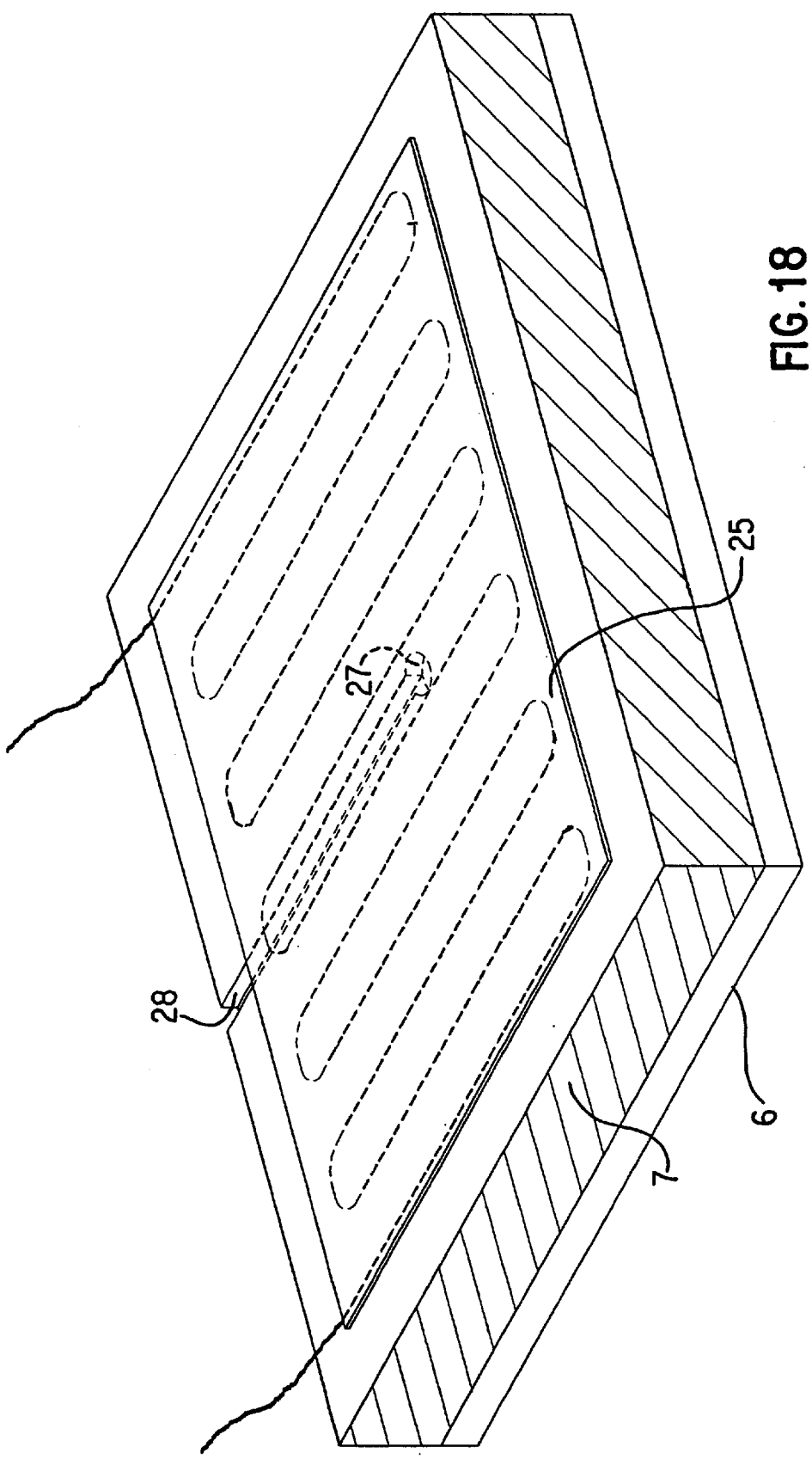
FIG. 18 shows a detail related to the construction and to the arrangement of the heating and temperature-control means.

According to a further variant embodiment, illustrated with reference to this second embodiment and being apparent from FIGS. 15 and 18, the superposed arrangement of the two plates 7, 7' which form the main poles P1 allows to dispose electric heating means between said two plates and immediately close to a temperature sensor 26. This arrangement has the advantageous effect that the sensor immediately detects temperature changes and allows reaction thereto more quickly. Moreover, as regards construction, the installation and assembly of the heater 25 is very simple, the latter being simply fixed between the two plates 7, 7'. The sensor 26 is also easy to assemble, and may be housed in a notch 27 formed in the face of one plate, whereat the two plates 7, 7' are in contact, while the connecting wires may be brought out of the pole P1 through a groove 28 which leads from the notch 27 to the closest peripheral edge of the plate wherein it is provided.

Advantageously, the heater 25 is provided in the form of a panel, for example made of plastic, having an appropriate thermal transmission coefficient, in which one or more resistors, of the coil-type, or similar are embedded. Also in the case of this arrangement, the heater may be provided in combination with the previous example as shown in FIGS. 1 to 14.

A further variant relates to the interposed element 13, in this case consisting of a C-shaped housing, with no lid thereon, and with the side turned towards the space defined by the magnet structure not being totally closed, but having a longitudinal central aperture 30. This construction further simplifies the fabrication of the interposed element 13, since the latter can be formed from a section, which may be cut up proportionately according to needs, while no longer requiring an additional part, such as the lid of the previous example as shown in FIGS. 1 to 14.

Figure 17:
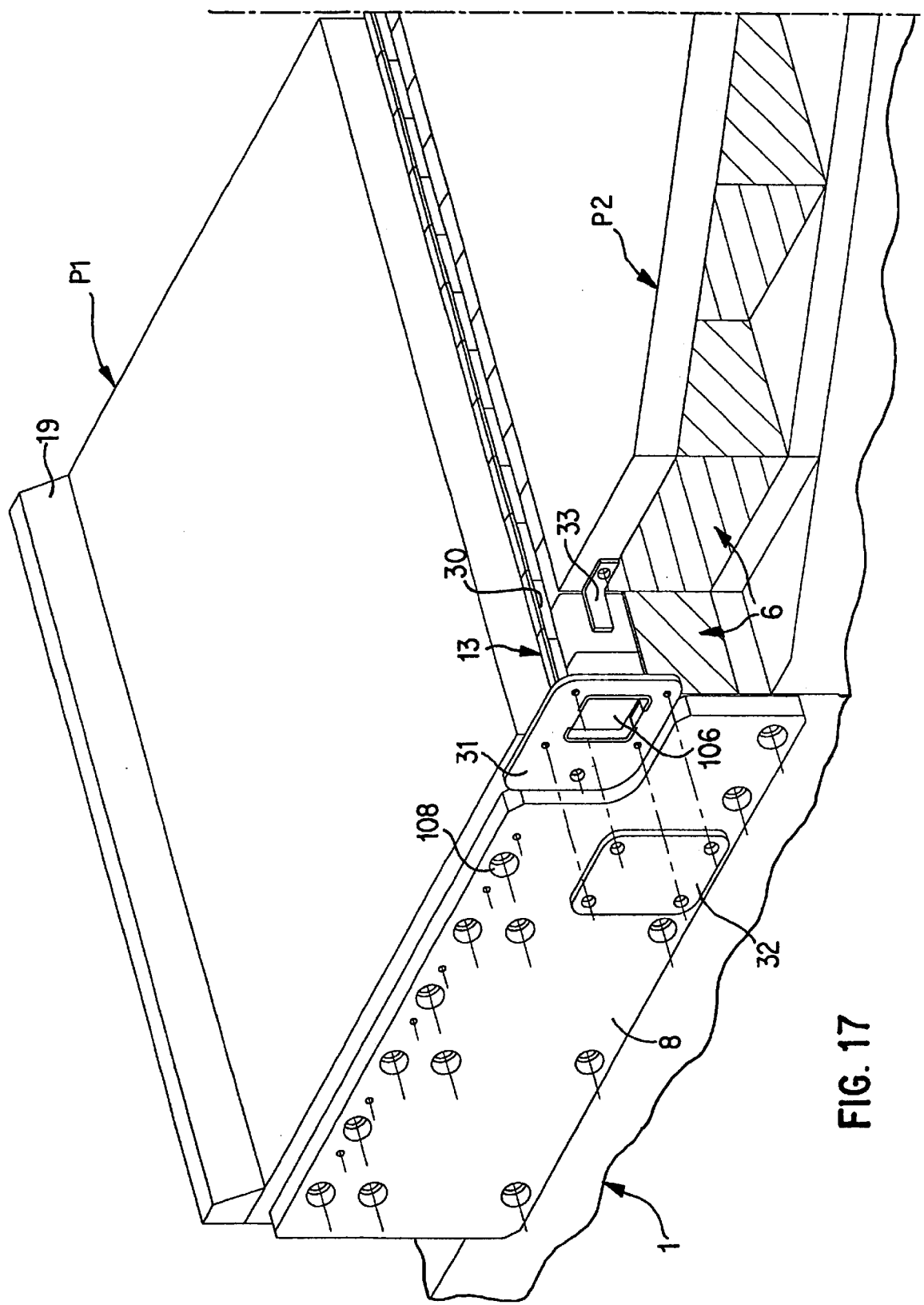
FIG. 17 is a perspective view of the area between the two main and secondary poles of the structure as shown in FIG. 15.

The present example as shown in FIGS. 15 and 17 also provides that the element 13 may be closed at its ends; this is obtained thanks to an end flange 31, which is welded or otherwise fastened to the two ends of the section 13. A lid 32 may be fastened to this flange 31, for example by means of screws, or similar. Moreover, the profile of the flange 31 and of the lid 32 may be complementary to a setback or recess formed in the lateral plates 8 for fastening the poles P1, so as to substantially complete said fastening plates in a substantially rectangular shape.

This arrangement may be provided individually or together with other variants, even in combination with one or more construction characteristics of the example as shown in FIGS. 1 to 14.

The secondary poles P2 are constructed substantially like the main poles, except for the inclinable plate, as obvious.

Also, the plate 7 of the secondary poles P2 is or may be further fastened to the intermediate element 13, as shown in FIG. 17, with a fastening bracket 33, locked by means of screws or similar or otherwise fastened to said two parts. Said bracket 33 is provided on both ends of the interposed element 13.

Figure 19:
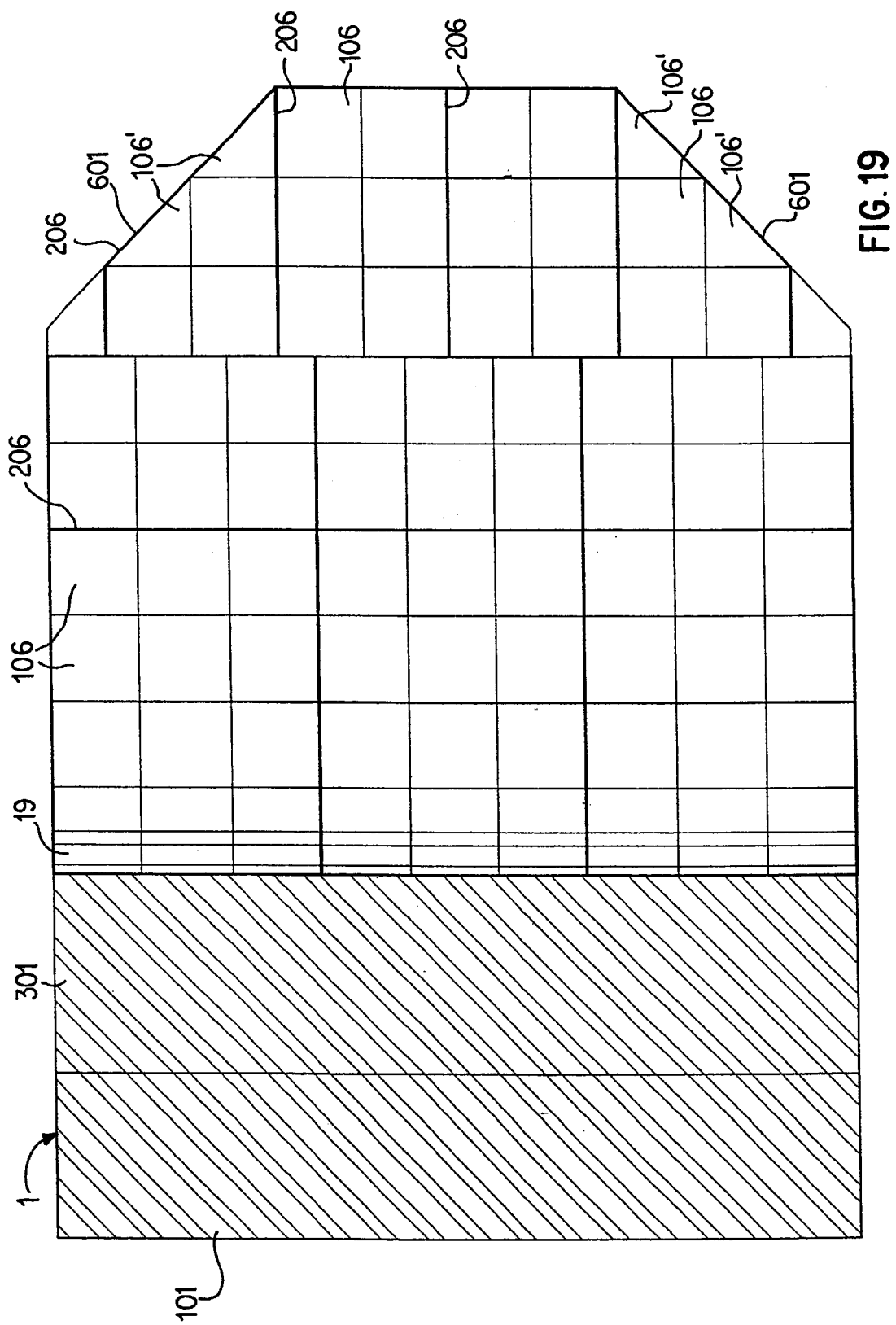
FIG. 19 is a top plan view of the layer of bricks made of a magnetized or magnetizable material according to a further improvement of the modular construction.
Figure 20:
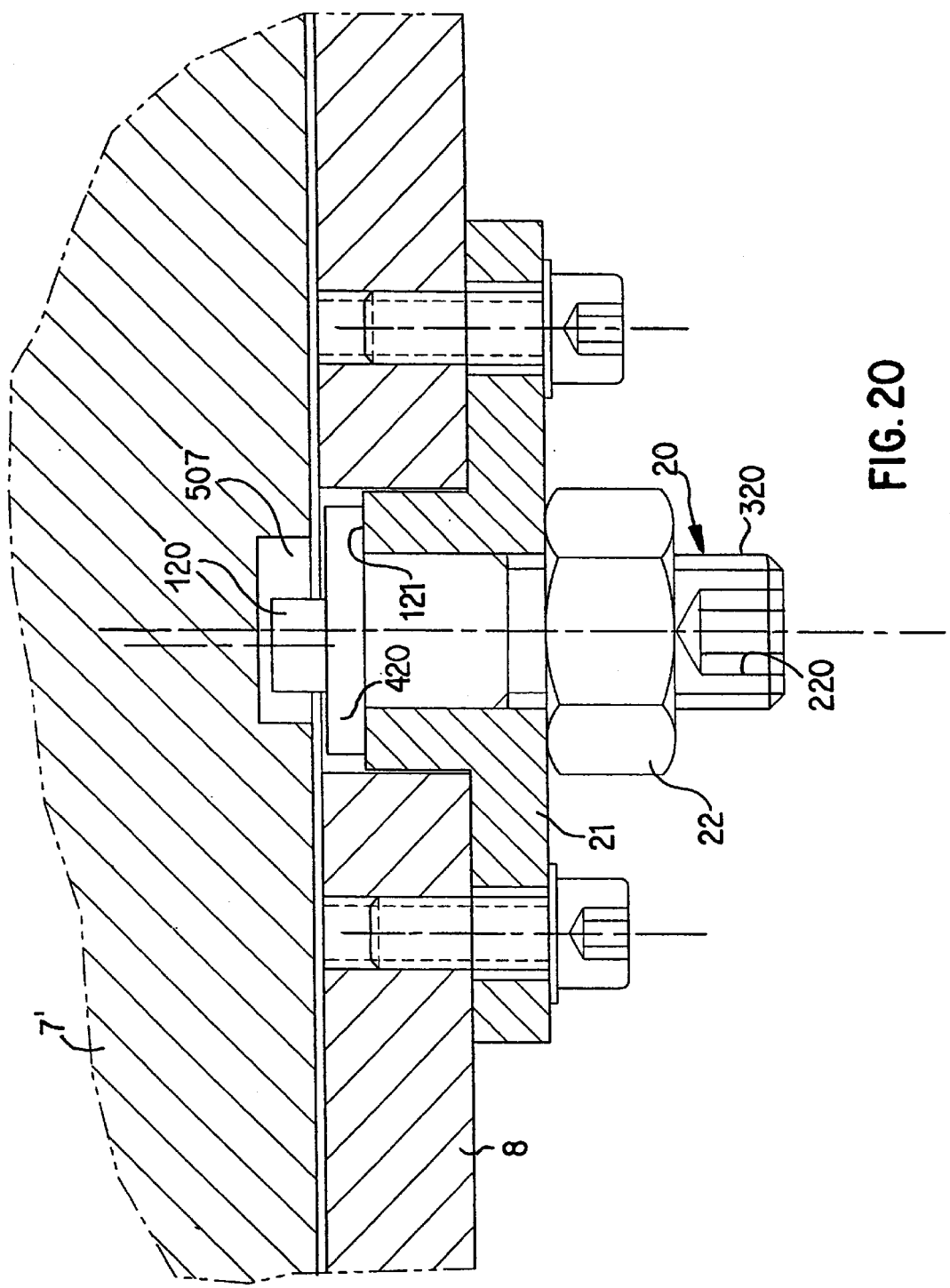
FIG. 20 shows a detail of a variant embodiment of the means for adjusting the inclination of the main pole.
Figure 22:
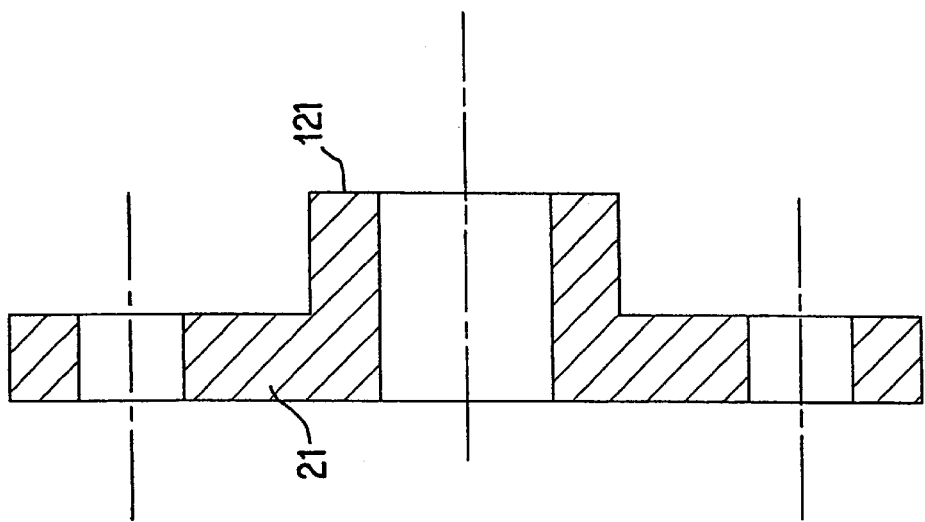
FIGS. 21 to 26 are different views of the means for adjusting the inclination of the main poles according to a first variant.
Figure 21:
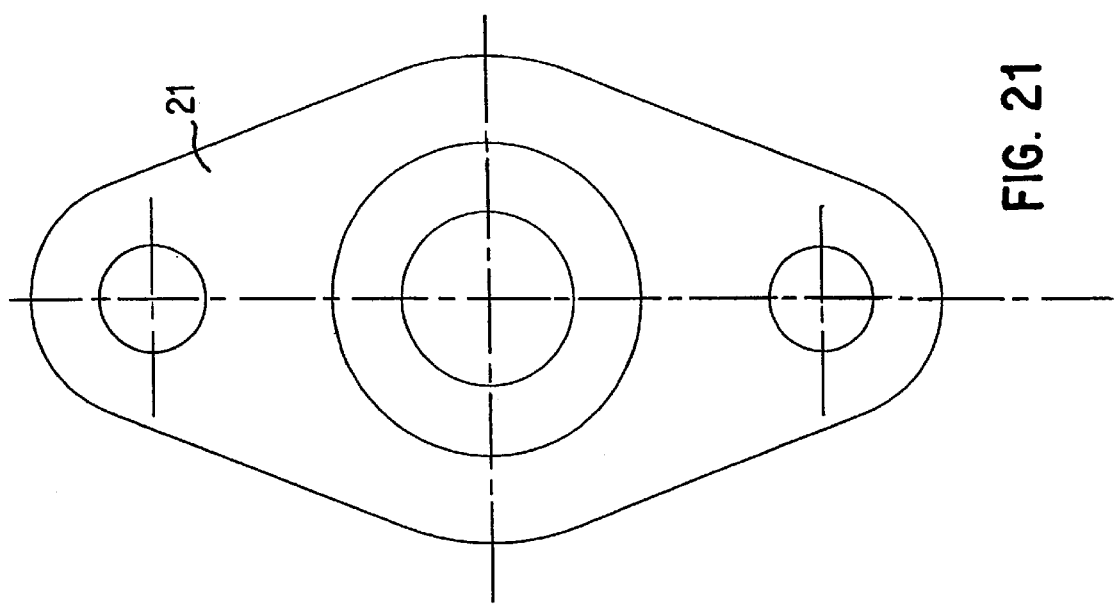
Figure 25:
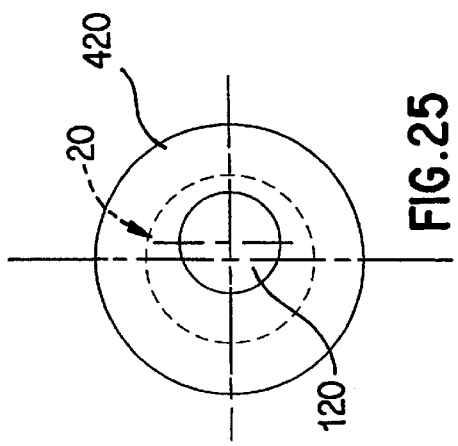

FIG. 19 is a plan view of the layer 6 of magnetized or magnetizable material with reference to the second embodiment. In this case, the dimensional conformity of the plate 201, 301 of the yoke 1 or of the bearing structure, with the bases of the modular elements and bricks is shown to be further improved with respect to what has been shown in FIG. 5 with reference to the first embodiment, thus providing a considerable reduction in the number of different bases and bricks and limiting the number of special pieces.

FIGS. 27 to 32 relate to a third embodiment in which the magnet has an annular shape and a rectangular section, and show how this configuration also allows to provide the arrangements described above for the two variants of the U-shaped magnet structure. In the illustrated embodiment, the annular bearing structure 1 has lateral blocks 50 made of a permanently magnetized or magnetizable material or of a ferromagnetic material, which may have a modular structure, and fastening means similar to those provided in the preceding figures.

The poles P1 (here main poles are only provided) also have a modular structure like that of the previous embodiments. However, in order to make the mounting of the poles P1 simpler, the present embodiment provides arrangements which allow the modules which form the layers of the permanently magnetized and/or magnetizable material 6 to be mounted on their respective bases 206 and to be assembled together, outside the ring-shaped bearing structure 1. This is aimed at a more convenient and quicker assembly. Also in this case, the sizes of the modules, of the bricks made of the permanently magnetized and/or magnetizable material are dimensionally correlated, so that the smallest number of different pieces may be obtained. In this case, the assembled piece comprising the bases and the layers of bricks has a considerable weight and in addition, if the material is permanently magnetized, magnetic forces may be exerted when the piece is inserted in the structure 1, which make its positioning therein even more critical. Therefore, a tubular drawer-like housing 43, substantially identical to the one of the interposed elements 13 of the previous example, is provided to insert the modular pre-assembled piece. However, here the drawer-like housing is removable and only acts as a drawer for introducing and positioning the pre-assembled piece.

The structure may be provided, directly and fixedly, with lateral guides whereon the drawer-like housing is made to slide, or the latter is inserted and locked in position to the magnet structure 1 by means of shoulders, flanges or other fastening tongues 143 and acts as a removable guide for the insertion of the pre-assembled piece.

In the embodiment, this second variant is shown. The pre-assembled piece has the bases 206 for the modules on the sides turned towards the bearing structure whereto it is to be fastened, and the drawer-like housing or the fixed insertion guide 43 has a C-shaped section and has an open side towards the corresponding plate of the bearing structure 1. Further, in order to allow the pre-assembled piece to be fitted therein, in the fixed, guide-like version, the housing 43 is long enough to project by its end sides far from and to a predetermined extent out of the structure.

The bottom side of the guide 43 has holes 243 having the function to allow the pre-assembled piece to be reached even from the inside of the magnet structure 1, to carry out operations assisting the introduction.

In this specific example, the pre-assembled piece can be locked in position thanks to magnetic force itself, while there are provided fastening means having the only function to ensure that it is locked in position with no staggering effect.

Figure 32:
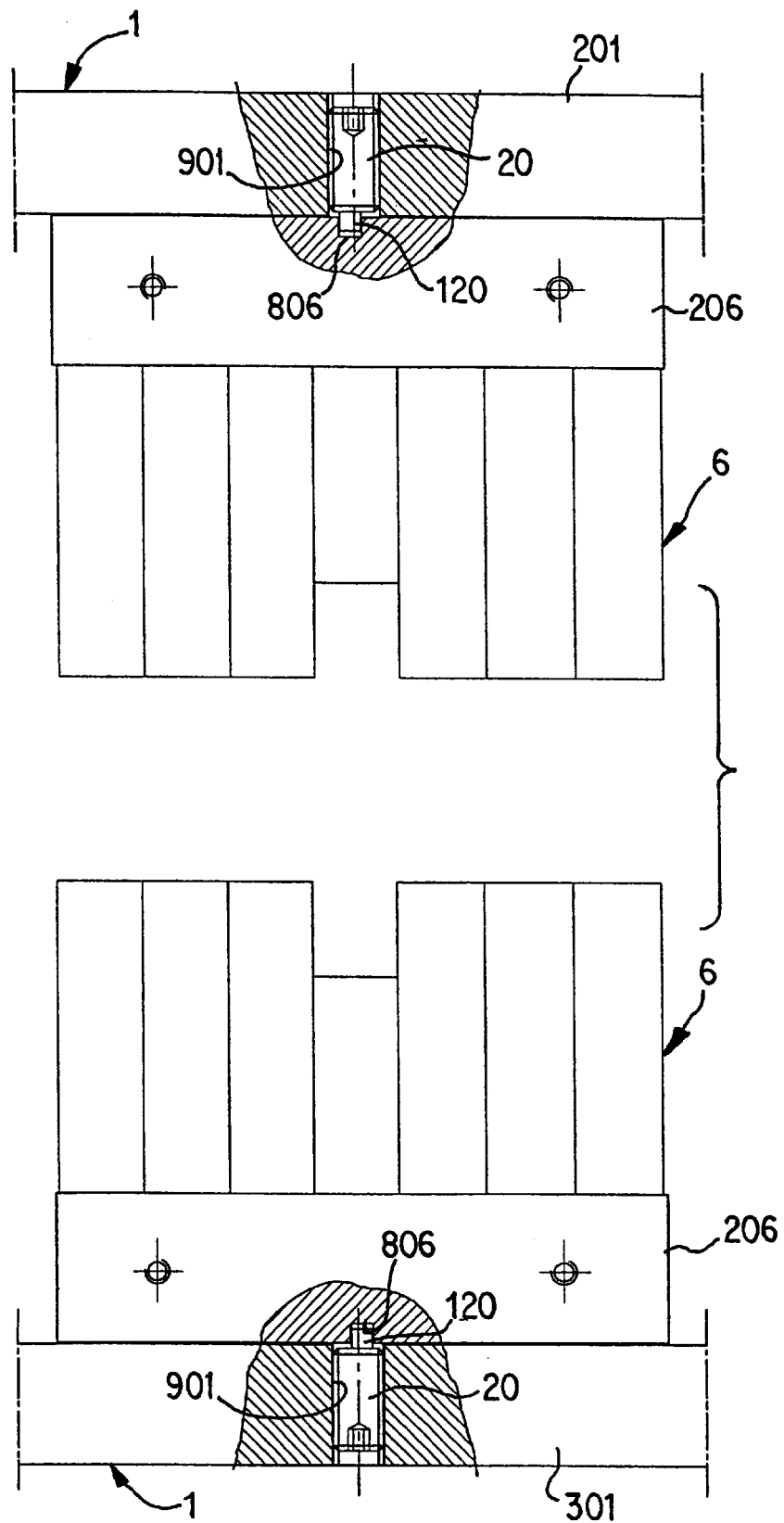

In order to ensure that the pre-assembled piece is correctly positioned in the associated plate of the magnet structure, there may be provided adjusting means, which may be made substantially like those provided for adjusting the inclination of the plates made of the high-permeability or ferromagnetic material. An example thereof is shown in FIG. 32. At least one threaded pivot 20, for each end area of the pre-assembled block may be screwed from the outside of the plates 201, 301 in a threaded through hole 901. The pivot 20 bears an eccentric extension 120, engaging in a coincident slot or in a continuous groove 806 formed in the contact face of the base 206.

After positioning the pre-assembled pieces, the drawer or the guide 43 is removed from the magnet structure 1.

The pre-assembled piece may also consist of independent submodules.

Obviously, the characteristics underlined in this third embodiment may be adopted individually or in combination with each other and with individual or combined characteristics resulting from the previous embodiments, and vice versa.

According to a further variant of the invention, the latter provides that the permanently magnetized material forming the magnet structure, i.e. the bricks 106, 106', 106" are magnetized only after being mounted on the bearing structure 1, and preferably when the layers of said bricks are correctly completed and positioned.

Naturally, the invention is not limited to the embodiments described and illustrated herein, but the latter may be greatly varied or modified, especially as regards construction, without departure from the guiding principle disclosed above and claimed below.

What is claimed is:

1. A magnet structure for Nuclear Magnetic Resonance imaging machines, comprising:

means for generating a magnetic field inside a space defined by the magnet structure, a bearing structure for supporting the generating means, the bearing structure including a plurality of plates, wherein at least a part of the generating means is modular;

wherein the modular structure has a limited number of basic pieces which, when combined together, form the means for generating the magnetic field, said basic pieces being advantageously dimensioned as rational submultiples of dimensions of the plates which form the bearing structure to which the basic pieces are attached.

2. A structure as claimed in claim 1, wherein the bearing structure forms the yoke for enclosing the magnetic flux, and the means for generating the magnetic fields is either of the permanent type or by induction.

3. A structure as claimed in claim 2, wherein there are provided means for adjusting the displacement of the plate/s which form the poles.

4. A structure as claimed in claim 1, wherein the basic pieces of the means for generating the magnetic field are further fastened together to support bases the support bases, being as large as a multiple of the basic elements, and as a rational submultiple of the surface whereat the bearing structure or the yoke is fastened to the plates, so as to form intermediate modular elements, i.e. comprising a certain predetermined number of basic pieces and designed to form the field generating element, in combination with other modular intermediate elements.

5. A structure as claimed in claim 4, wherein the bases supporting the basic pieces which form the modules for fabricating the magnetic field generating means, are in a part of the plates of the bearing structure or of the yoke, or a part of the non-permenently magnetizable elements.

6. A structure as claimed in claim 1, wherein the material forming the basic pieces, of standard or special size may be permenently magnetized prior to assembly or may be magnetized after the assembly of the bearing structure.

7. A structure as claimed in claim 1, wherein the bearing structure and the field generating means or the modular elements composing them, or the bases for the intermediate modules have means for preventive restrained joint attachment, providing at least one and/or, limited to predetermined tolerances, even two or three degrees of freedom.

8. A structure as claimed in claim 7, wherein said restrained joint means include complementary guides, provided on the bearing structure and/or on the field generating means, or vice versa, or even restrained joints between adjacent modular elements which form the magnetic field generating elements.

9. A structure as claimed in claim 8, wherein the restrained joint means have complementary undercuts.

10. A structure as claimed claim 1, wherein the means for fastening the individual elements together are positioned so as to allow direct access thereto from the outer peripheral sides of the bearing structure.

11. A structure as claimed in claim 1, wherein the modular elements are provided in combination with means for inserting parts of the magnet structure, which parts may be modularly assembled outside said structure, and attached thereto while being substantially joined together.

12. A structure as claimed in claim 1, wherein the field generating means include basic pieces having such shapes as to always ensure that, when taken together, they are slightly smaller than the support base for forming the intermediate module.

13. A structure as claimed in claim 1, wherein there is provided, for at least a part of the basic pieces, a housing in the form of a drawer, a box or channel-shaped or tubular member which is open and/or may be opened and closed at least on one side, or with at least one partially open side, and in such a way as to have tongues for retaining the basic pieces.

14. A structure as claimed in claim 13, wherein the drawer or channel is open on at least two end sides, and that said end sides may be at least partially closed.

15. A structure as claimed in claim 13, wherein said channel-, drawer- or case-like housing is only used as an inserting tool, which is taken off or anyway removed once the field generating modular elements have been positioned.

16. A magnet structure for Nuclear Magnetic Resonance imaging machines, comprising:

means for generating a magnetic field inside a space defined by the magnet structure, a bearing structure for supporting the generating means, the bearing structure including a plurality of plates, wherein at least a part of the generating means is modular;

wherein the plates are mutually fastened to each other by fastening means provided in a predetermined position, and further comprising:

centering means for adjusting the plates of the bearing structure.

17. A structure as claimed in claim 16, wherein the plates may be joined together in alternative ways as to obtain several configurations.

18. A structure as claimed in claim 16, wherein the structure is a closed annular structure, in which the plates are connected in such a way as to form a rectangular or polygonal section, or an annular structure which is closed at an aperture or an inverted U-shaped or C-shaped open structure.

19. A structure as claimed in claim 18, wherein the plates forming the same sides in the different geometries may be used, the required number of plates for the selected geometry being used and assembled.

20. A magnet structure for Nuclear Magnetic Resonance imaging machines, comprising:

means for generating a magnetic field inside a space defined by the magnet structure, a bearing structure for supporting the generating means, the bearing structure including a plurality of plates, wherein at least a part of the generating means is modular;

wherein the modular structure has a limited number of basic pieces which, when combined together, form the means for generating the magnetic field, said basic pieces being advantageously dimensioned as rational submultiples of dimensions of the plates which form the bearing structure to which the basic pieces are attached;

wherein the magnetic field generating means comprises a permanent magnet and that the magnetic field generating means comprise a plurality of layers of the basic pieces made of a permanently magnetized or magnetizable material, having the shape of parallelepipeds, with a number of different sizes.

21. A structure as claimed in claim 20, wherein there are provided bases for supporting the basic pieces for fabricating the intermediate elements or the field generating means which bases are all of the same size, which size corresponds to a rational submultiple of the area whereat they are attached to the bearing structure, each of them being meant to bear a predetermined number of identical basic pieces and possibly a predetermined number of special basic pieces.

22. A structure as claimed in claim 21, wherein the bases for supporting the basic pieces are housed in a recess which is as thick as the associated plate of the bearing structure and may be made of the same material as the bearing structure.

23. A magnet structure for Nuclear Magnetic Resonance imaging machines, comprising:

means for generating a magnetic field inside a space defined by the magnet structure, a bearing structure for supporting the generating means, the bearing structure including a plurality of plates, wherein at least a part of the generating means is modular;

wherein the modular structure has a limited number of basic pieces which, when combined together, form the means for generating the magnetic field, said basic pieces being advantageously dimensioned as rational submultiples of dimensions of the plates which form the bearing structure to which the basic pieces are attached;

wherein at least one plate made of a ferromagnetic material is laid over the field generating modular elements, on a face opposite to the bearing structure whereto the latter are attached, whereas said plate is kept in position by bridge supports, having hooks or fastening members engaged in seats parallel to the face of the plate which forms the pole in the corresponding side edge, and in seats parallel to the former, in the edge of the plate associated to the bearing or yoke structure.

24. A structure as claimed in claim 23, wherein the means for fastening the plate/s which form each pole comprising fastening plates laying over the corresponding peripheral side edges of the two plates associated to the pole and of the bearing or yoke structure, said peripheral side edges being provided parallel to and flush with each other, whereas said fastening plates are fastened to said two plates by bolts, or similar.

25. A structure as claimed claim 23, wherein the plate or at least one of the plates forming each pole are supported in such a way as to be movable perpendicularly to themselves and independently for each end of the two fastening side edges.

26. A structure as claimed in claim 25, wherein the fastening plates hold pivot pins in circular holes and are engaged in slots parallel to the faces of the movable plate which forms the pole by an eccentric end, whereas the bolts for fastening the fastening plate to the movable plate which forms the pole are engaged in slots oriented transverse to the slots of the plate, i.e., substantially perpendicular to the faces of said movable plate which forms the pole.

27. A structure as claimed in claim 25, wherein the movable plate of the pole has adjustment means consisting of a pivot, substantially perpendicular thereto and turning idly therein while keeping itself engaged by one end in a removable undercut, whereas the pivot has rotatable grasping means in its intermediate area, and the opposite end is engaged by an exterior thread in a threaded hole formed in the stationary part whereon the movable plate of the pole lays, said means being provided at each corner area of said movable plate and the through holes for the fastening bolts of said movable plate in the fastening plate slots oriented parallel to the pivots.

28. A structure as claimed in claim 27, wherein the adjustment means of the movable plate, which forms the pole are provided in combination with at least a part of the modular elements which form the field generating means, for the positioning adjustment of said pre-assembled modular elements with respect to each other and to the plate (201, 301) of the bearing structure or of the yoke.

29. A structure as claimed in claim 23, wherein at least some poles have a structure composed of at least two superposed plates, whereas between at least two of the at least two superposed plates which form the pole a heating element is provided, which heating element has the form of a thin panel, whereas one of the two plates has, on the face turned towards the other associated plate, a groove, a housing notch for a temperature sensor, which is placed immediately close to the heater.

30. A magnet for creating a magnetic field for use in nuclear magnetic resonance imaging, the magnet comprising:

a support structure having a plurality of pieces;

a magnet structure supported by the support structure so as to form the magnetic field in a predetermined space, wherein the magnet structure is comprised of at least one planar layer that includes a plurality of pieces that are substantially similar in size and shape to each other so that the pieces can be assembled into a desired configuration; and a ferromagnetic planar layer adjacent the magnet structure, the ferromagnetic planar layer including a plurality of pieces.

31. The magnet of claim 30, wherein the magnet structure is arranged between the support structure and the ferromagnetic layer.

32. The magnet of claim 31, further comprising a planar pole piece arranged on the ferromagnetic layer on the side opposite the magnet structure.

33. The magnet of claim 30, wherein at least some of the plurality of similar pieces in the magnet structure are identical to each other.

34. The magnet of claim 33, wherein at least some of the plurality of pieces in the ferromagnetic layer are identical to each other.

35. The magnet of claim 30, wherein at least some of the plurality of pieces in the ferromagnetic layer are identical to each other.

36. The magnet of claim 30, wherein the plurality of pieces in the ferromagnetic layer have a high permeability.

37. A magnet for creating a magnetic field for use in nuclear magnetic resonance imaging, the magnet comprising:

a support structure;

a magnet structure supported by the support structure so as to form the magnetic field in a predetermined space;

wherein at least one of the support structure and the magnet structure are comprised of a plurality of pieces that are substantially similar in size and shape to each other so that the pieces can be assembled into a desired configuration;

wherein the magnet structure comprises a plurality of pieces having a parallelepiped shape and a plurality of pieces having a triangular shape, wherein the magnet structure includes more parallelepiped shaped pieces than triangular shaped pieces.

38. The magnet of claim 37, wherein the magnet structure has a dimension equal to a multiple of the parallelepiped shaped pieces.

39. The magnet of claim 37, wherein the support structure includes a base that is made up of a plurality of base pieces that are substantially similar in size and shape to each other, wherein the magnet structure is secured to a first side of the base.

40. The magnet of claim 39, further comprising a support plate arranged on a second side of the base so that the base is sandwiched between the magnet structure and the support plate.

41. The magnet of claim 40, further comprising a yoke and a plurality of fastening plates, wherein the support plate is secured to the yoke by means of the fastening plates, which fastening plates are arranged perpendicular to the support plate.

42. The magnet of claim 40, further comprising means for adjusting an inclination of the support plate.

43. A magnet for creating a magnetic field for use in nuclear magnetic resonance imaging, the magnet comprising:

a support structure having a plurality of pieces;

a magnet structure supported by the support structure so as to form the magnetic field in a predetermined space, wherein the magnet structure is comprised of at least one planar layer that includes a plurality of pieces that are substantially similar in size and shape to each other so that the pieces can be assembled into a desired configuration; and a first ferromagnetic planar layer; and means for adjusting an orientation of the ferromagnetic planar layer.

44. The magnet of claim 43, further comprising:

a second ferromagnetic layer arranged between the magnet structure and the first ferromagnetic planar layer.

45. The magnet of claim 44, further comprising:

a third ferromagnetic layer arranged between the magnet structure and the second ferromagnetic planar layer, wherein the third ferromagnetic planar layer comprises a plurality of pieces.

* * * * *